United States Patent [19]
Hasse

[11] Patent Number: 5,819,068
[45] Date of Patent: Oct. 6, 1998

[54] TEMPORALLY DRIVEN SIMULATION ENGINE

[75] Inventor: Paul L. Hasse, Minneapolis, Minn.

[73] Assignee: United Defense, LP, Arlington, Va.

[21] Appl. No.: 656,795

[22] Filed: May 31, 1996

[51] Int. Cl.⁶ .................................................. G06F 9/455
[52] U.S. Cl. .......................................... 395/500; 364/578
[58] Field of Search .................................... 364/578, 488, 364/489, 490; 395/500

[56] References Cited

U.S. PATENT DOCUMENTS

| | | | |
|---|---|---|---|
| 4,821,220 | 4/1989 | Duisberg et al. | 364/578 |
| 5,247,651 | 9/1993 | Clarisse | 395/500 |
| 5,544,348 | 8/1996 | Umeda et al. | 395/500 |
| 5,604,907 | 2/1997 | Conner et al. | 395/683 |
| 5,613,099 | 3/1997 | Erickson et al. | 395/500 |
| 5,617,514 | 4/1997 | Dolby et al. | 706/45 |
| 5,640,546 | 6/1997 | Gopinath et al. | 395/551 |
| 5,650,946 | 7/1997 | Trimberger | 364/578 |

OTHER PUBLICATIONS

Modeling of Local Reduction in TiSi2 and CoSi2 Growth Near Spacers in MOS Technologies: Influence of Mechanical Stress and Main Diffusing Species Fornara and Poncet, May 1996, pp. 73–76.

Grid Adaptation Near Moving Boundaries in Two Dimensions for IC Process Simulation Law, Oct., 1995, pp. 1223–1230.

Technology Limitations for N+/P+ Polycide Gate CMOS Due to Lateral Dopant Diffusion in Silicide/Polysilicon Layers Chu et al., Jun., 1991, pp. 696–698.

*Primary Examiner*—Kevin J. Teska
*Assistant Examiner*—Dan Fiul
*Attorney, Agent, or Firm*—Douglas W. Rudy; Michael B. K. Lee

[57] ABSTRACT

A simulation engine for temporally driven functional causal model application program is disclosed. An object oriented approach is used to create model definitions in which a system of interacting agents are assembled into a tree structure of agents and subsystems. The interacting agents which exhibit or endowed with time dependent behaviors are identified and are given priority in a queue. The temporal nature of the interacting agents and other characteristics are considered in the simulation of the model.

13 Claims, 26 Drawing Sheets

CLASS DATA STRUCTURES

INITABLE-DATA
| | |
|---|---|
| NAME | SYMBOL |
| INITFORM | SEXP |

SUBSYSTEM-ELEMENT
| | |
|---|---|
| NAME | SYMBOL |
| TYPE | SYMBOL |
| INPUT-INITFORMS | (< > < > < >) |
| STATE-VARIABLE-INITFORMS | (< > < > < >) |

ELEMENT-PORT
| | |
|---|---|
| NAME | SYMBOL |
| ELEMENT | SYMBOL |
| DELAY | NUMBER |

SUBSYSTEM-INPUT-PORT
| | |
|---|---|
| NAME | SYMBOL |
| DESTINATIONS | (< > < > < >) |

SUBSYSTEM-OUTPUT-PORT
| | |
|---|---|
| NAME | SYMBOL |
| SOURCES | (< > < > < >) |

SUBSYSTEM-STATE-VARIABLE
| | |
|---|---|
| NAME | SYMBOL |
| STATE-VARIABLES | (< > < > < >) |

STATE-VARIABLE-MAPPING
| | |
|---|---|
| NAME | SYMBOL |
| ELEMENT | SYMBOL |

SUBSYSTEM-CONNECTION
| | |
|---|---|
| NAME | SYMBOL |
| SOURCE | (< > < > < >) |
| DESTINATIONS | (< > < > < >) |
| DELAY | NUMBER |

SUBSYSTEM-CLASS ⟋52
| | |
|---|---|
| ELEMENTS | (< > < > < >) |
| CONNECTIONS | (< > < > < >) |
| INPUTS | (< > < > < >) |
| OUTPUTS | (< > < > < >) |
| STATE-VARIABLES | (< > < > < >) |
| DOCUMENTATION | STRING |

AGENT-CLASS ⟋54
| | |
|---|---|
| TIME-DEPENDENT | T OR NIL |
| RUN-METHOD | DEFMETHOD |
| INPUTS | (< > < > < >) |
| OUTPUTS | (SYMBOL SYMBOL) |
| STATE-VARIABLES | (< > < > < >) |
| DOCUMENTATION | STRING |

FIG. 2A

CLASS DATA STRUCTURES

| INITABLE-DATA | |
|---|---|
| NAME | SYMBOL |
| INITFORM | SEXP |

| SUBSYSTEM-ELEMENT | |
|---|---|
| NAME | SYMBOL |
| TYPE | SYMBOL |
| INPUT-INITFORMS | (< > < > < >) |
| STATE-VARIABLE-INITFORMS | (< > < > < >) |

| ELEMENT-PORT | |
|---|---|
| NAME | SYMBOL |
| ELEMENT | SYMBOL |
| DELAY | NUMBER |

| SUBSYSTEM-INPUT-PORT | |
|---|---|
| NAME | SYMBOL |
| DESTINATIONS | (< > < > < >) |

| SUBSYSTEM-OUTPUT-PORT | |
|---|---|
| NAME | SYMBOL |
| SOURCES | (< > < > < >) |

| SUBSYSTEM-STATE-VARIABLE | |
|---|---|
| NAME | SYMBOL |
| STATE-VARIABLES | (< > < > < >) |

| STATE-VARIABLE-MAPPING | |
|---|---|
| NAME | SYMBOL |
| ELEMENT | SYMBOL |

| SUBSYSTEM-CONNECTION | |
|---|---|
| NAME | SYMBOL |
| SOURCE | (< > < > < >) |
| DESTINATIONS | (< > < > < >) |
| DELAY | NUMBER |

/— 52

| SUBSYSTEM-CLASS | |
|---|---|
| ELEMENTS | (< > < > < >) |
| CONNECTIONS | (< > < > < >) |
| INPUTS | (< > < > < >) |
| OUTPUTS | (< > < > < >) |
| STATE-VARIABLES | (< > < > < >) |
| DOCUMENTATION | STRING |

/— 54

| AGENT-CLASS | |
|---|---|
| TIME-DEPENDENT | T OR NIL |
| RUN-METHOD | DEFMETHOD |
| INPUTS | (< > < > < >) |
| OUTPUTS | (SYMBOL SYMBOL) |
| STATE-VARIABLES | (< > < > < >) |
| DOCUMENTATION | STRING |

INSTANCE DATA STRUCTURES

TEMPORALLY DRIVEN SIMULATION ENGINE

FIELD OF THE INVENTION

The present invention relates to a computer implemented general purpose object-oriented simulation engine. The invention supports simulations of any system of interacting agents in which the behaviors of the agents can be functionally described and the temporal properties of these behaviors evaluated.

DESCRIPTION OF THE PRIOR ART

Prior art systems rely on forward chaining production rules, which use a truth maintenance system to preserve model consistency in order to simulate electro-mechanical systems. The systems worked very well for simple, non-parallel electro-mechanical operations and components. However, for complex operations and components the prior art is deficient in several respects.

Primarily, the prior art is extremely tedious to define or code-up a model. The rules needed mapped only in a very abstract way back to the causal structure of the system being modeled. Further, once a model has been developed, modifications of the model by anyone but the original rule author was extremely difficult. Changes in rules to fix old problems may create new ones. Further, if the system to be modified included a parallel behavior it was extremely difficult to correctly represent the temporal sequencing of the behaviors. The best approach to overcome this problem is to adjust the defining order of the rules. Accordingly, the prior methods employ a trial and error approach to sequencing which is both time consuming and difficult to validate. Furthermore, for certain connective topologies, there may not even exist an ordering of the rules that can successfully capture the true sequencing of the system.

SUMMARY OF THE INVENTION

The present invention overcomes the deficiencies of a rule-based approach to modeling, especially the issue of sequencing. An object-oriented simulation approach is used in the present invention. This approach provides a simpler language for model definition in addition to an increase in the efficiency of model development and production.

Simulation is, interalia, the representation and modeling of the behavior of agents and their interactions. In the present invention the word "agent" refers to the actual subject being modelled and the word "object" refers to the representation of the actual subject. Accordingly, agents, for example, are represented by objects composed of a set of inputs, outputs and state variables. The inputs and outputs are used to represent interactions between agents. Agent interaction is modeled as a data flow from the causing agent to the affected agent. This data flow represents, for example, the transmission of force in the case of a physical subject or object. For agents which are non-physical such as, for example, data information, ideas and concepts, the data flow represents the transmission of data. State variables are used to represent the state of an agent at a particular point in time. State variables usually represent characteristics of the agent which vary over time.

A system of interacting agents may be hierarchically grouped into a tree structure of agents and subsystems. The behavior of agents and their interactions are time dependent. Accordingly, time must be simulated in addition with other characteristics which should be considered in simulating an interactive system comprising a group of agents with their own sphere of influence.

The present invention considers the behavior of a group of interacting agents and utilizes a Temporally Driven Functional Causal Engine to simulate models.

Specific advances, features and advantages of the present invention will become apparent upon examination of the following description and drawings dealing with several specific embodiments thereof.

BRIEF DESCRIPTION OF THE DRAWINGS

2. FIG. 2A and 2B are block diagrams of the objects used in model descriptions and instantiation.

DESCRIPTION OF THE PREFERRED EMBODIMENT

Simulation is a dynamic representation of the real world. It is an important tool used for a variety of analysis. The simulation engine of the present invention can be adapted to a variety of applications. For example, applications including system analysis, design trade-off studies, control algorithm design, diagnostics and training applications.

Figure 1A:
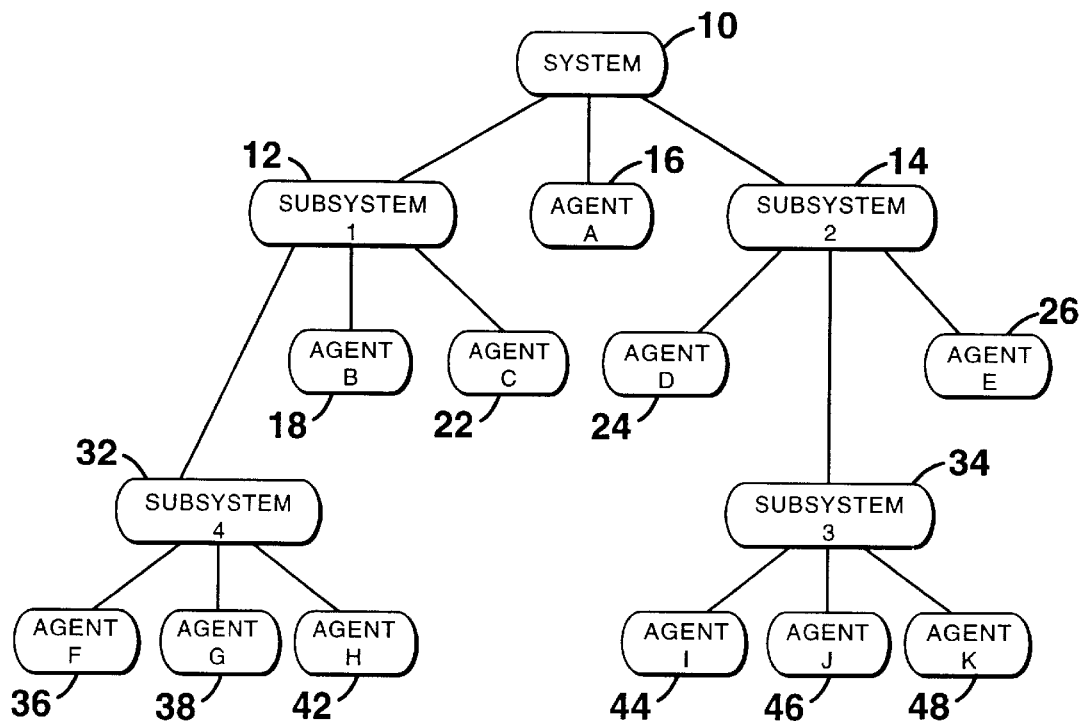
FIG. 1A and 1B are block diagrams showing a system of interacting agents hierarchically grouped into a tree structure of agents and subsystems.
Figure 1B:
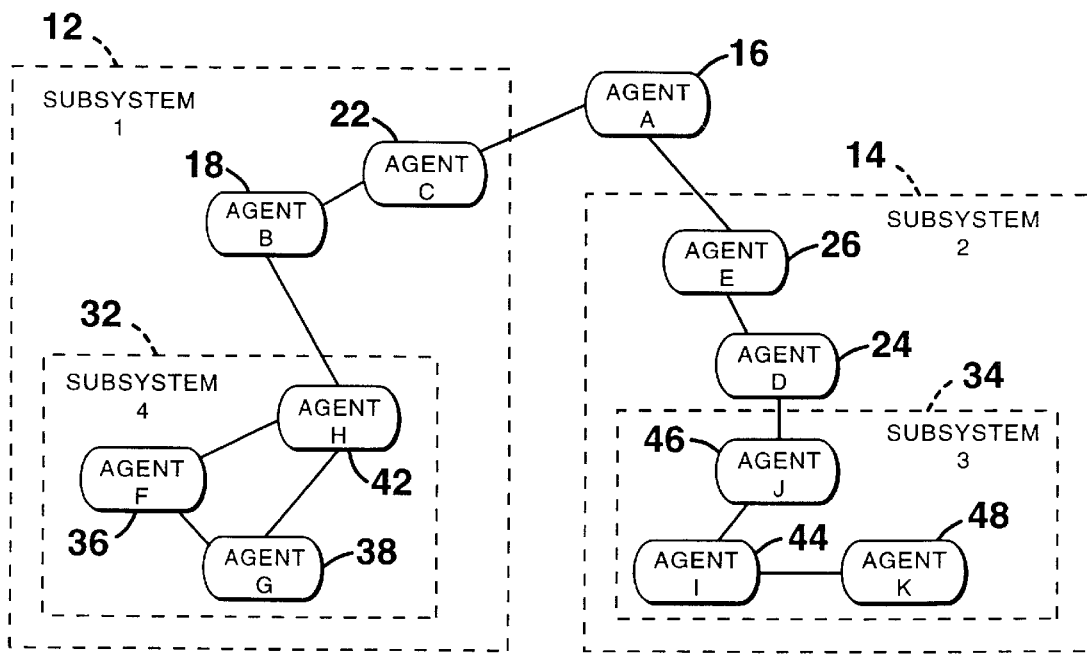

Referring now to FIGS. 1A and 1B, a system of interacting agents are shown grouped together, hierarchically, into a tree of agents and subsystems. System 10 comprises subsystem 12, subsystem 14 and agent 16. Further subsystem 12 comprises agent 18, agent 22 and subsystem 32. Similarly, subsystem 14 includes agent 24 and agent 26 and subsystem 34. Both subsystems 32 and subsystems 34 comprise agents 36, 38, 42 and agents 44, 46, 48, respectively.

Figure 2B:
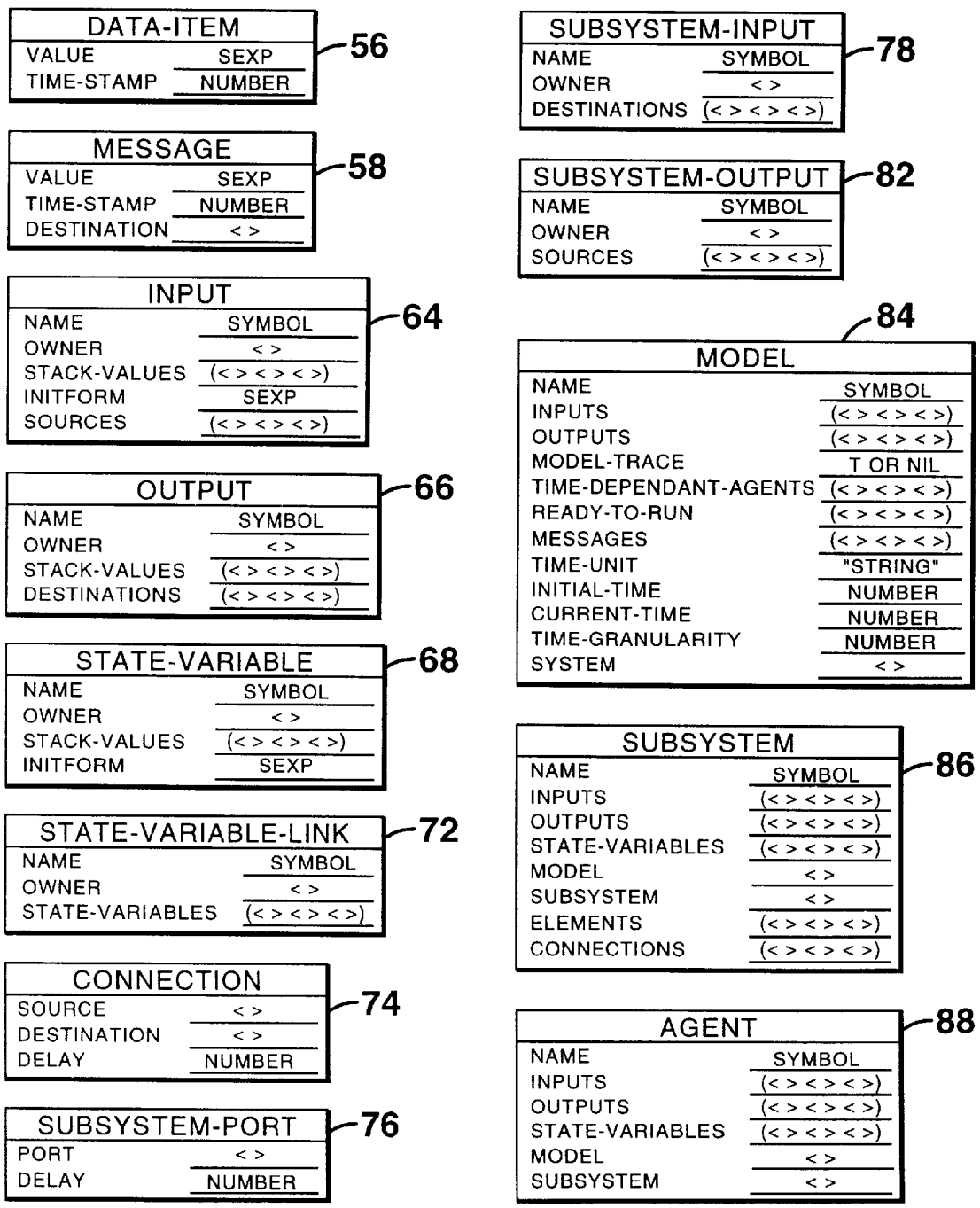

FIG. 2A and 2B contain the Temporally Driven Functional Causal Model kernel of which the simulation engine comprises subsystem class 52 and agent class 54 under the class data structure. Further, the simulation engine, under the instance data structures includes: data item 56, message 58, input 64, output 66, state-variable 68, state subsystem input 78, subsystem output 82, model 84, subsystem 86 and agent 88. The subsystem classes are used to describe a model. The blocks under the instance data structures columns are used in model instantiation.

Figure 3:
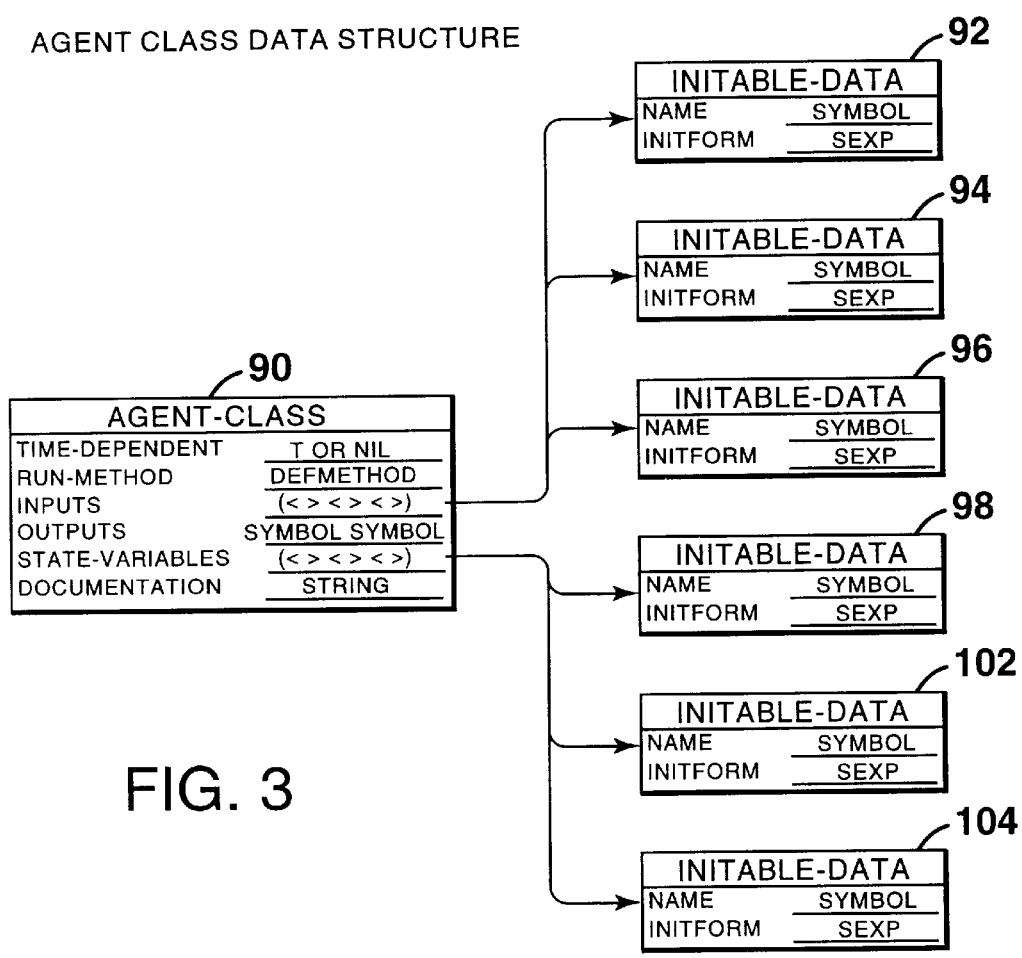
FIG. 3 is a block diagram showing an agent class data structure.

FIG. 3 is a block diagram showing agent class data structure. Agent class 90 includes several elements as indicated. The input element communicates with initiable data 92, initiable data 94 and initiable data 96. The state-variable also communicates with initiable data 98, initiable data 102 and initiable data 104. Agent classes contain all the information needed to create instances of the agent. The data is used by the agents' initialize-instance method.

Figure 4:
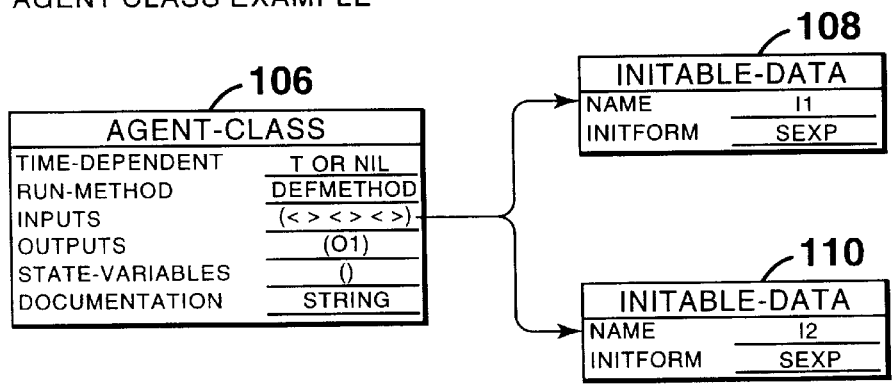
FIG. 4 is a block diagram showing an agent class.

FIG. 4 is a basic agent class example in which the input element of agent class 106 is connected to initiable data 108 and initiable data 110. The inputs are indicated as input I1 and I2 and a single output O1.

Figure 5A:
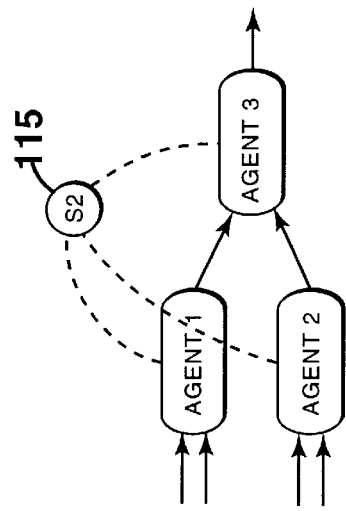
FIGS. 5A, 5B, and 5C show the first level subsystem of an exemplary model.
Figure 5B:
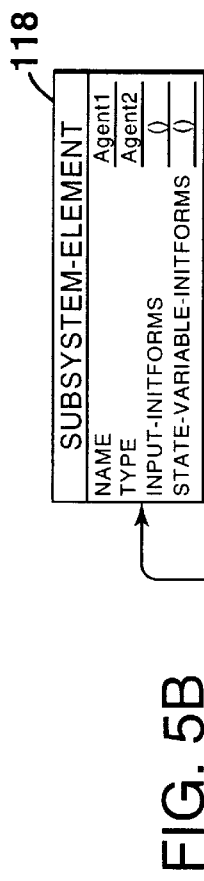
Figure 5B:
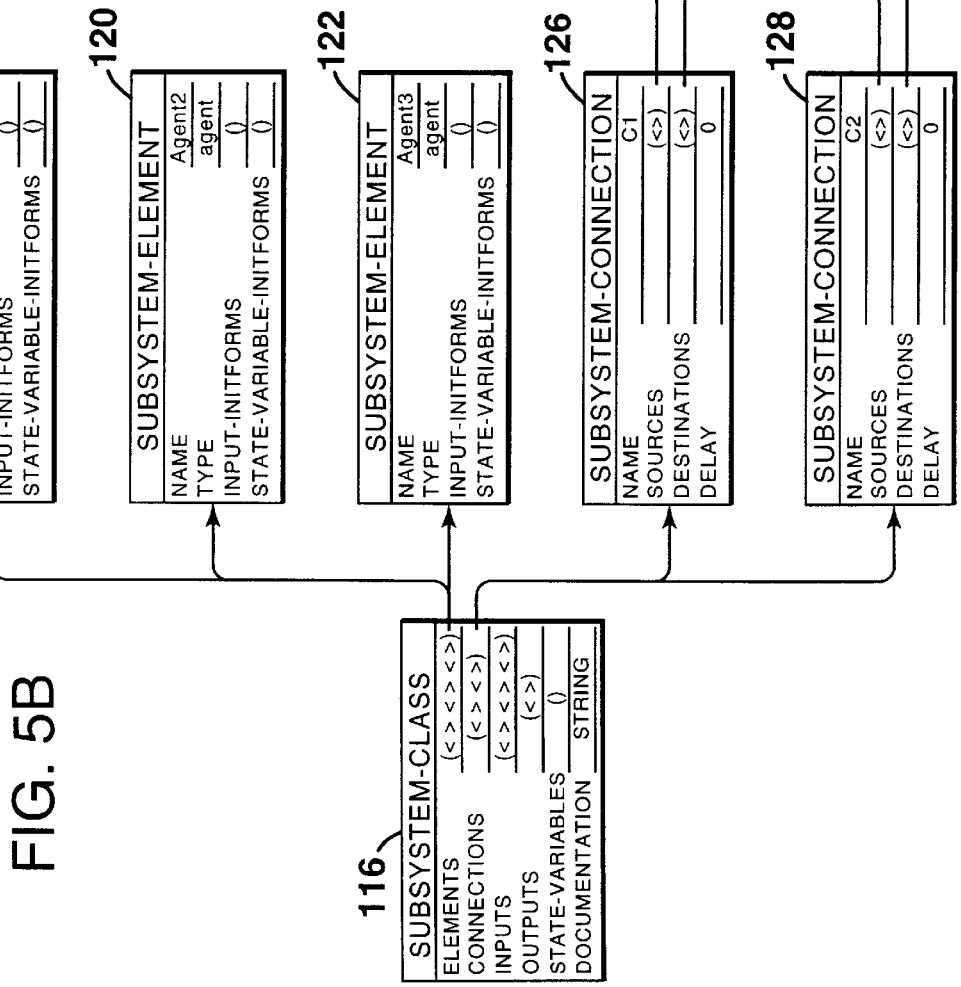
Figure 5C:
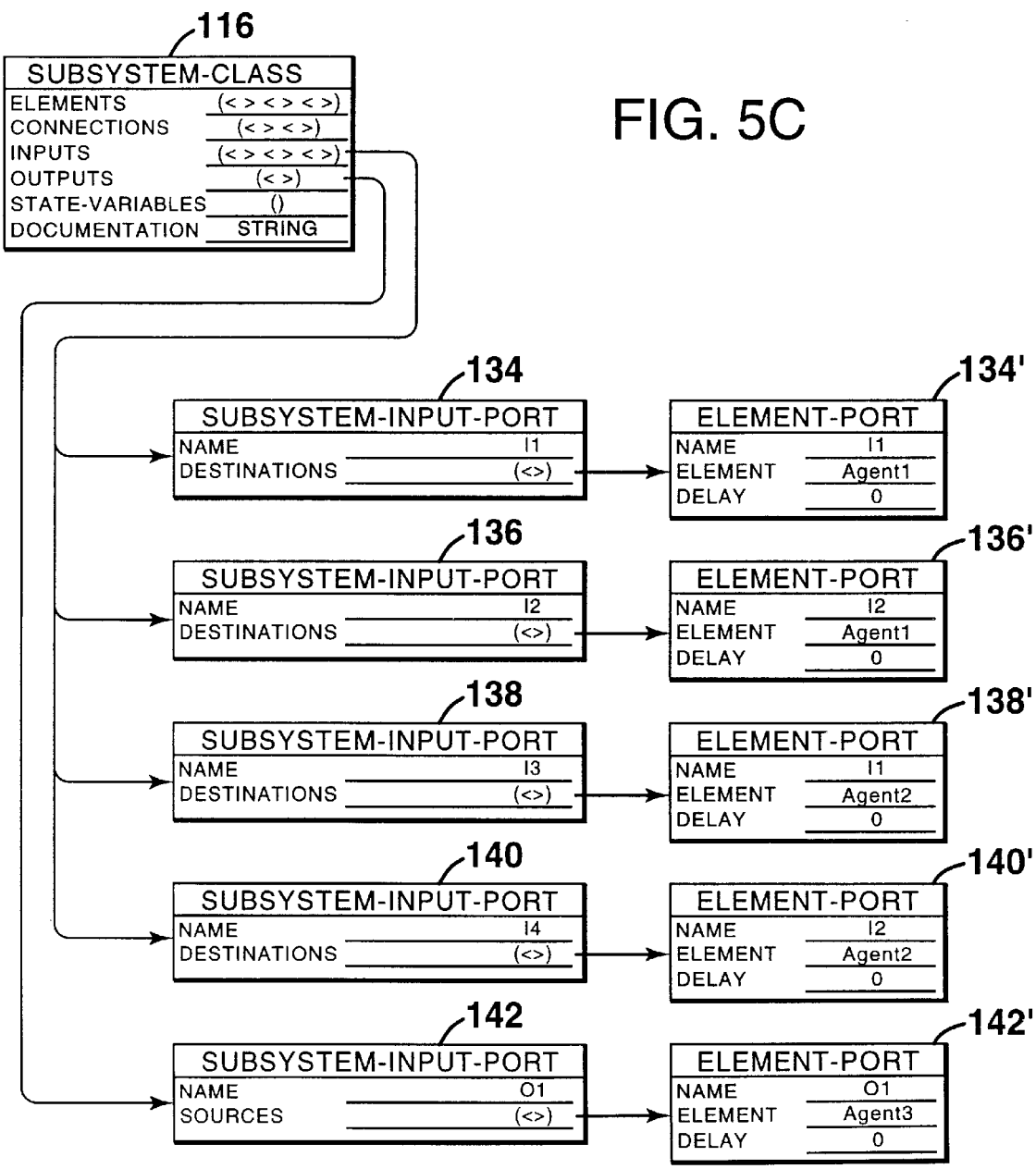
Figure 6A:
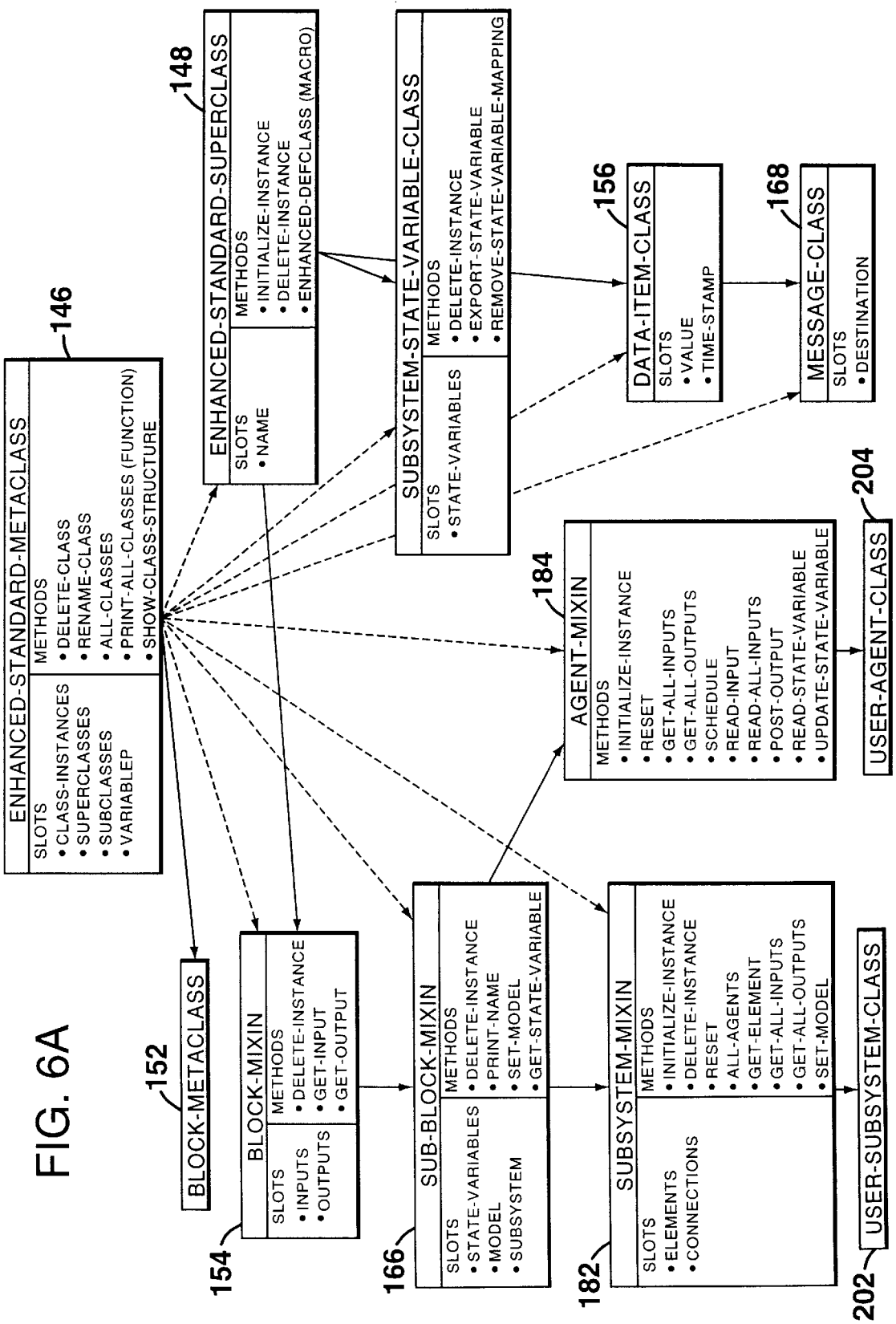
FIGS. 6A, 6B, 6C, and 6D are block diagrams depicting metaclass and superclass links.
Figure 6B:
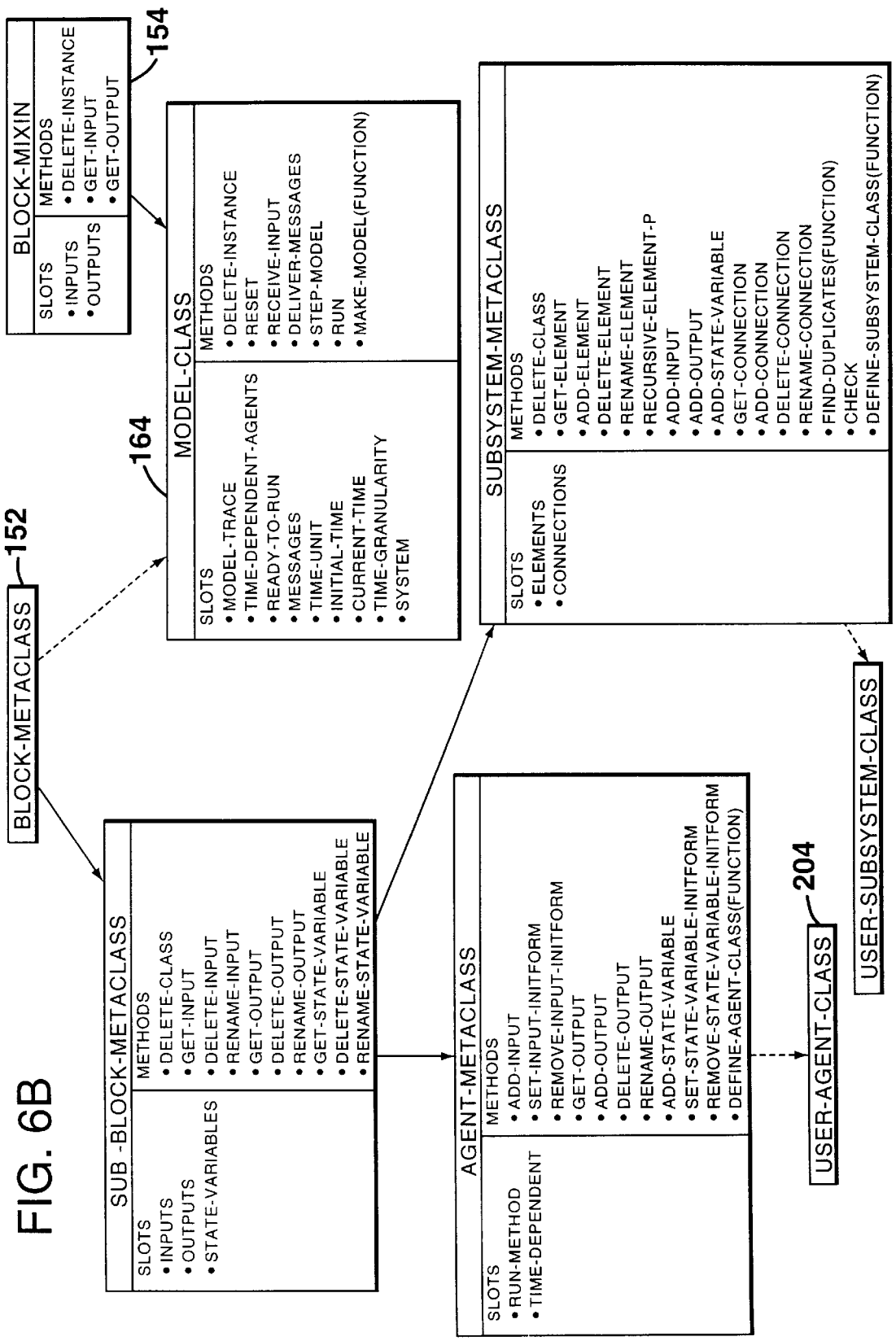
Figure 6C:
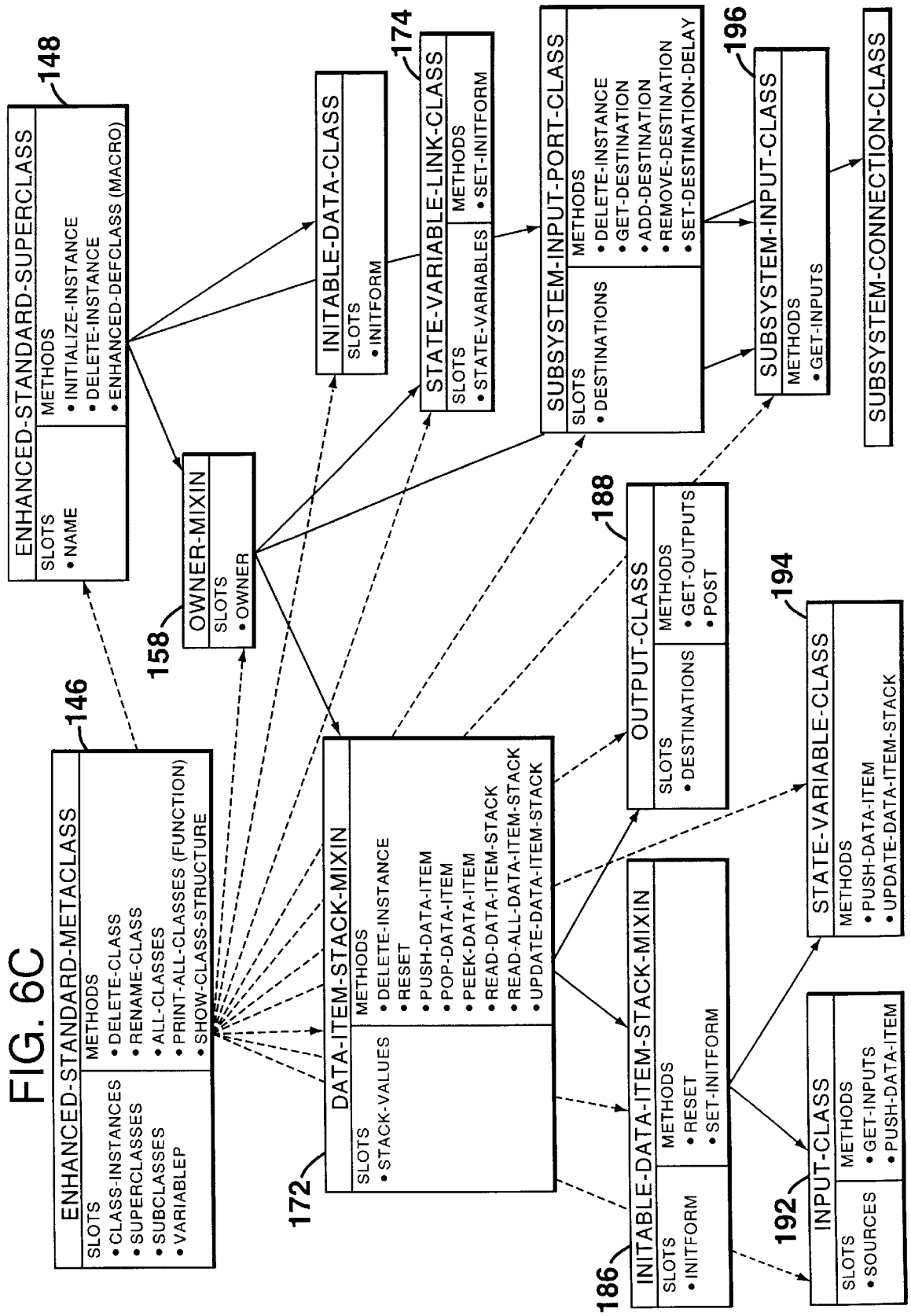
Figure 6D:
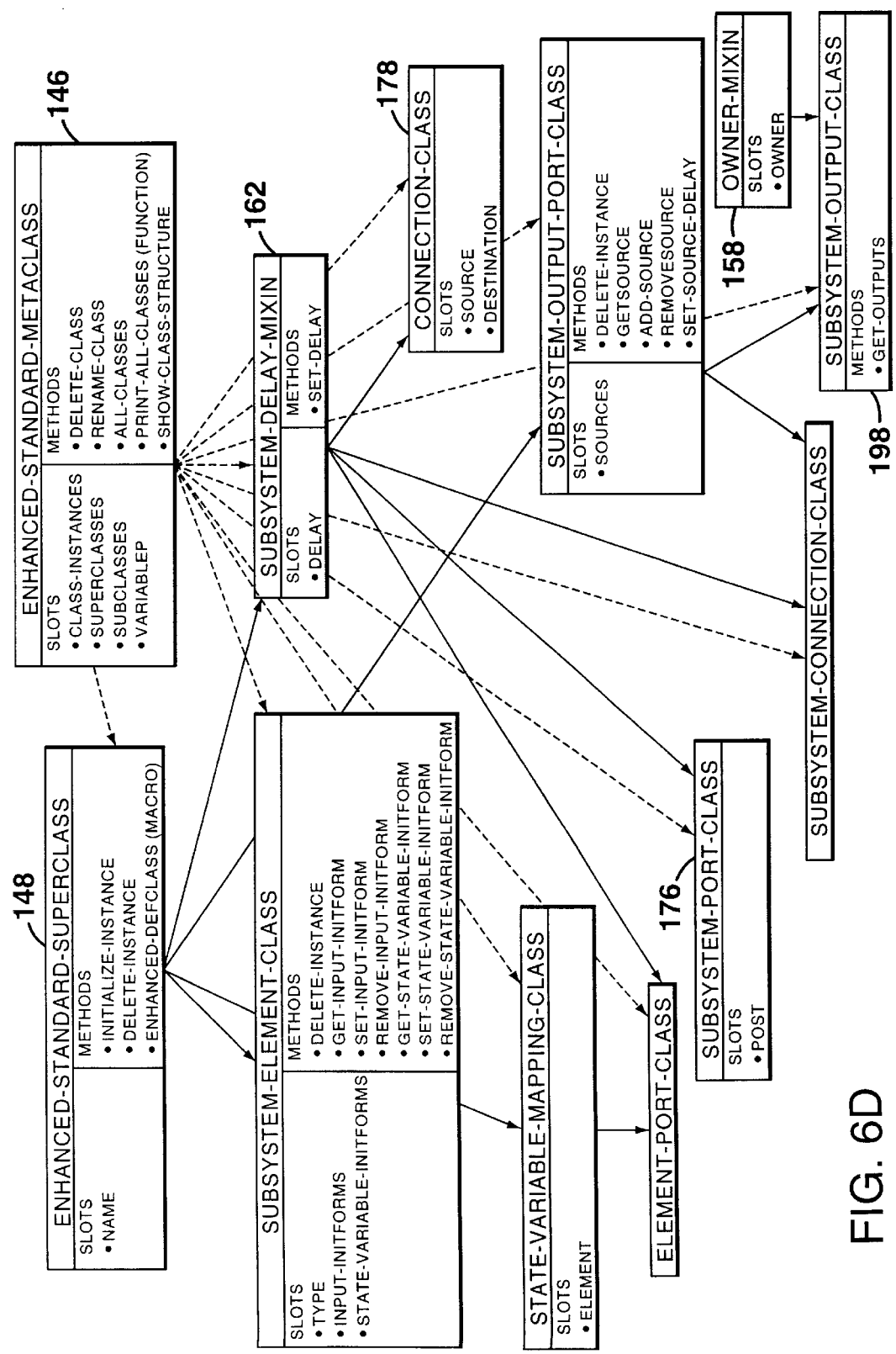

FIGS. 5A and 5B and 5C are agent class examples. FIG. 5A shows how agents 1 and 2 merge into agent 3. In the alternate, agent 1 and agent 2 could be a part of system 115 in which agent 3 may be contained as well (refer to the broken line). FIG. 5B shows the structural arrangement of subsystem-class 116. The elements of subsystem-class 116 include subsystem-element 118, subsystem-element 120, and subsystem-element 122. The subsystem connections include blocks 126 and 128. These subsystems are further connected to element port 126' and element port 128', respectively. Additionally, destination elements from subsystem connection 126 and subsystem connection 128 are joined to element ports 127 and 129, respectively. Subsystem-class 116 is in communication with four input ports 134, 136, 138 and 140. The input ports transfer data into element ports 134', 136', 138' and 140'. Subsystem-class 116 is also connected to output port 142 which in turn transfers output data to element port 142'.

FIG. 6A, 6B, 6C and 6D depicts the class structure of the present invention. The broken line connection denotes metaclass links and the solid connection denotes superclass links. Enhanced standard metaclass block 146 is the upper structure from which enhanced standard superclass 148 is derived. Block metaclass 152 is connected with enhanced standard metaclass 146 with a superclass link as indicated. Similarly, the present invention class structure constitutes, interalia, enhanced standard superclass having superclass links with block mixin 154, data item class 156, owner mixin 158, subsystem delay mixin 162. Block metaclass 152 has a metaclass link with model class 164. Further, block mixin 154 has a superclass link with model class 164. Block mixin 154 also provides a superclass link with subblock mixin 166. Data item 156 includes message class 168 having a superclass link therewith.

Further, owner mixin 158 exhibits superclass link with data-item-stack-mixin 172 and state-variable-link class 174. Similarly, subsystem-delay-mixin 162 is connected by a superclass link to subsystem-port-class 176 and connection class 178. Subsystem mixin 182 and agent mixin 184 are individually connected by a superclass link to sub-block mixin 166. Further, initiable-data-item-stack-mixin 186 and artport-class 188 include individual superclass links with data-item-stack-mixin 172. Input class 192 and state-variable-class 194 include individual superclass links with initiable-data-item-stack mixin 186. Subsystem input class 196 includes a superclass link with owner-mixin 158. Similarly, subsystem output class 198 includes a superclass link with owner-mixin 158. User subsystem class 202 includes a superclass link with subsystem-mixin 182 and user-agent-class 204 includes a superclass link with agent-mixin 184.

Figures 7A, 7B:
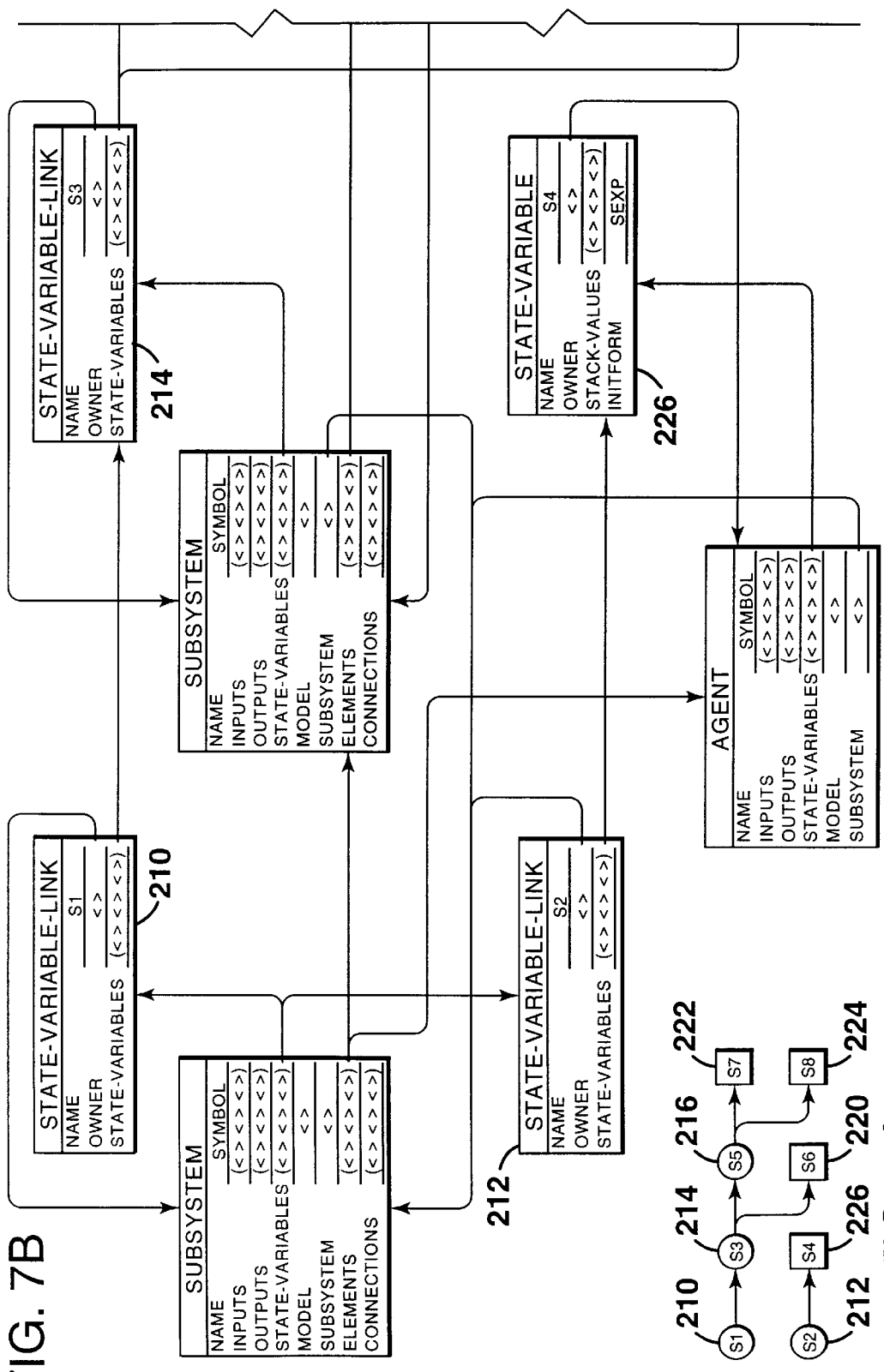
FIGS. 7A, 7B, and 7C form a block diagram showing exemplary hierarchical state variables.
Figure 7C:
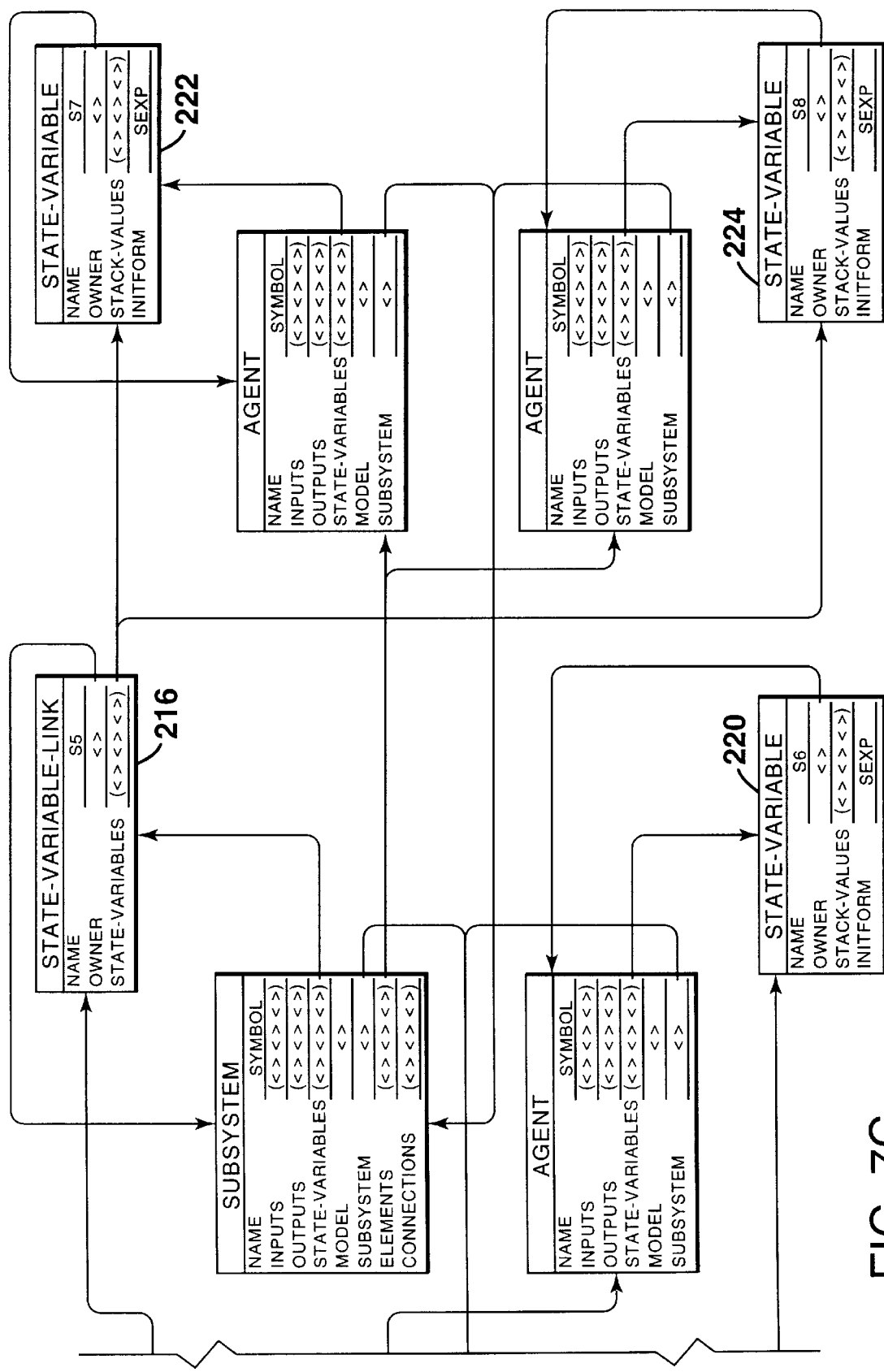
Figure 8A:
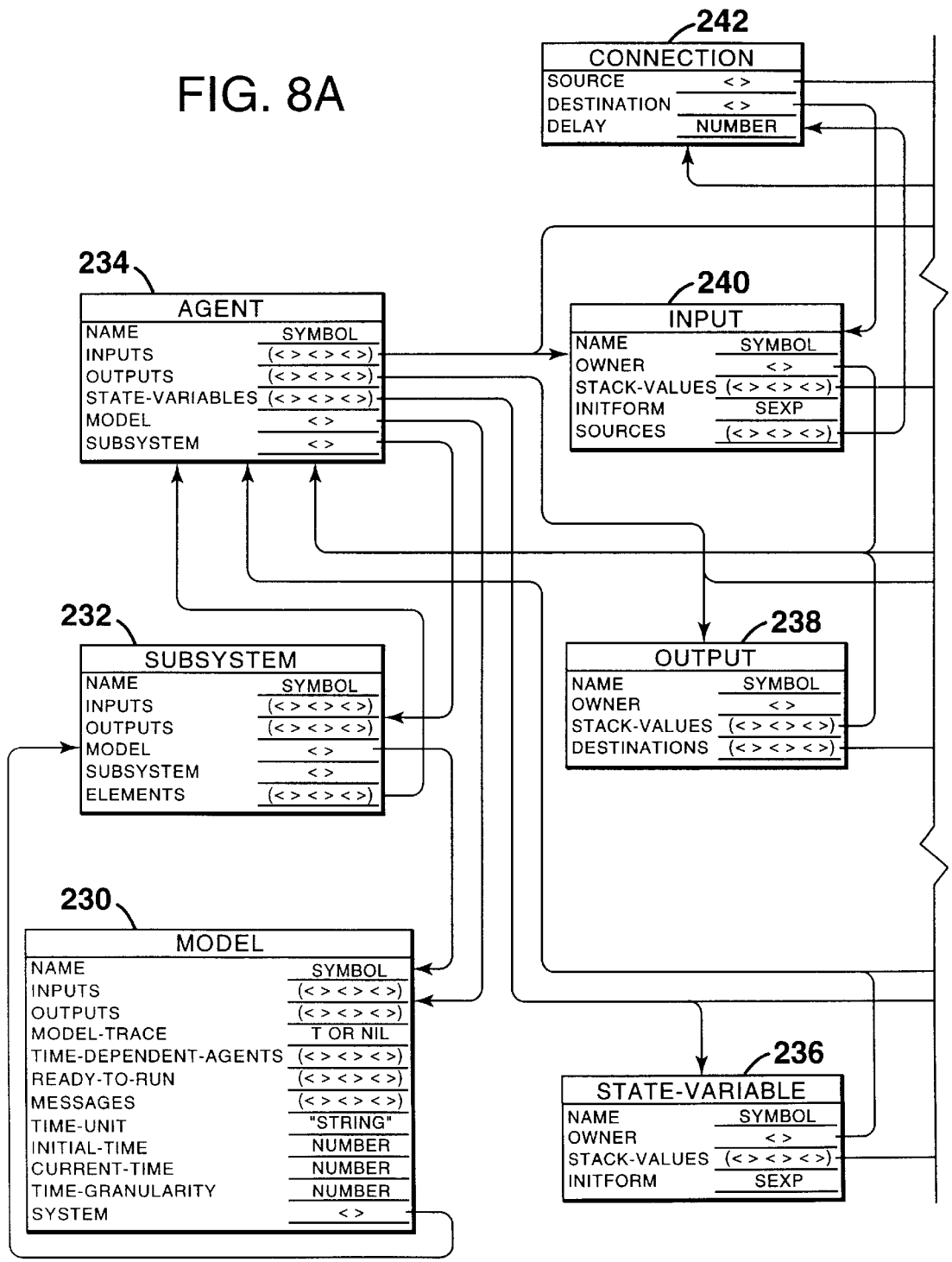
FIGS. 8A, 8B, 8C, and 8D form a block diagram of agent data structures.
Figure 8B:
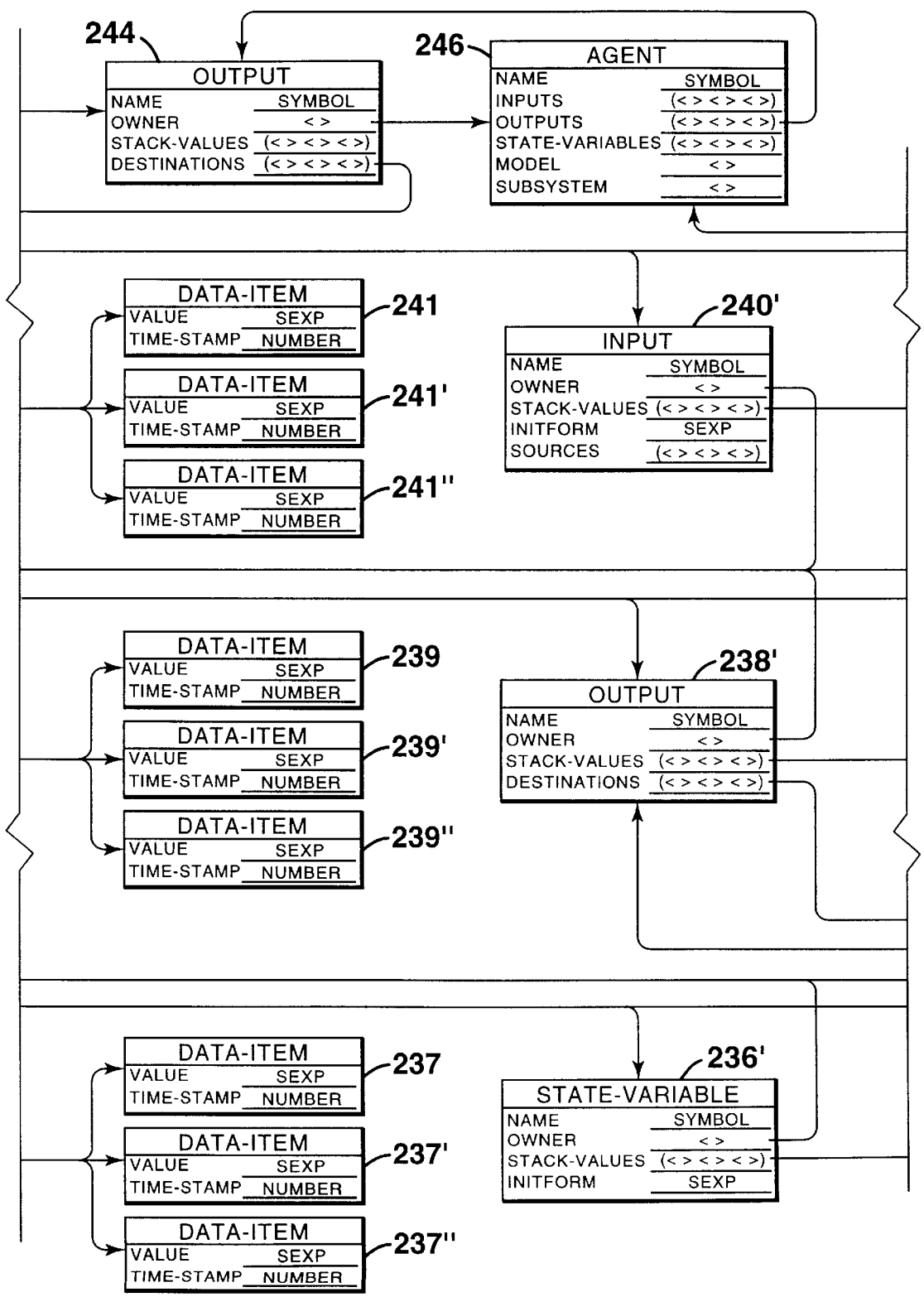
Figure 8C:
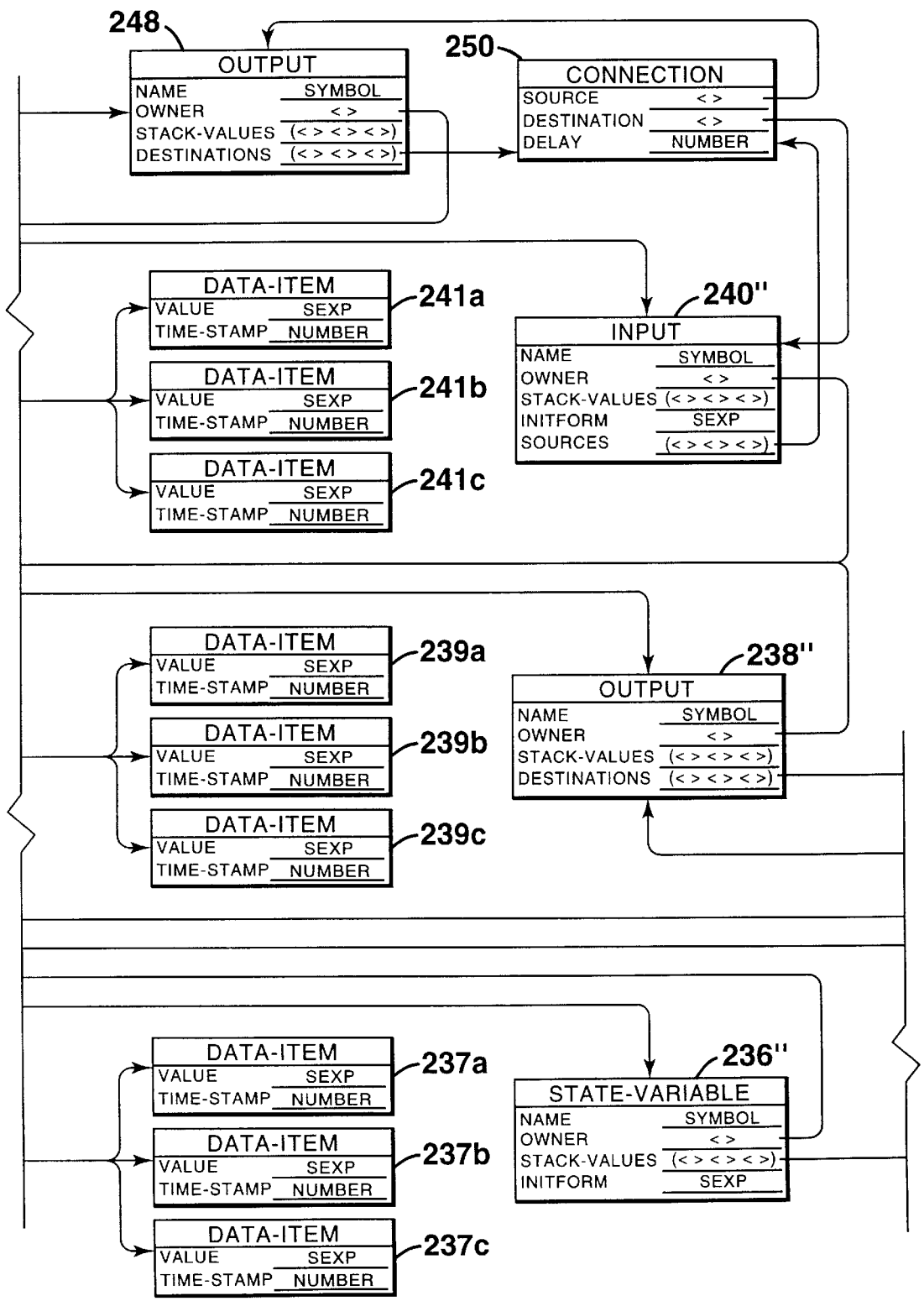
Figure 8D:
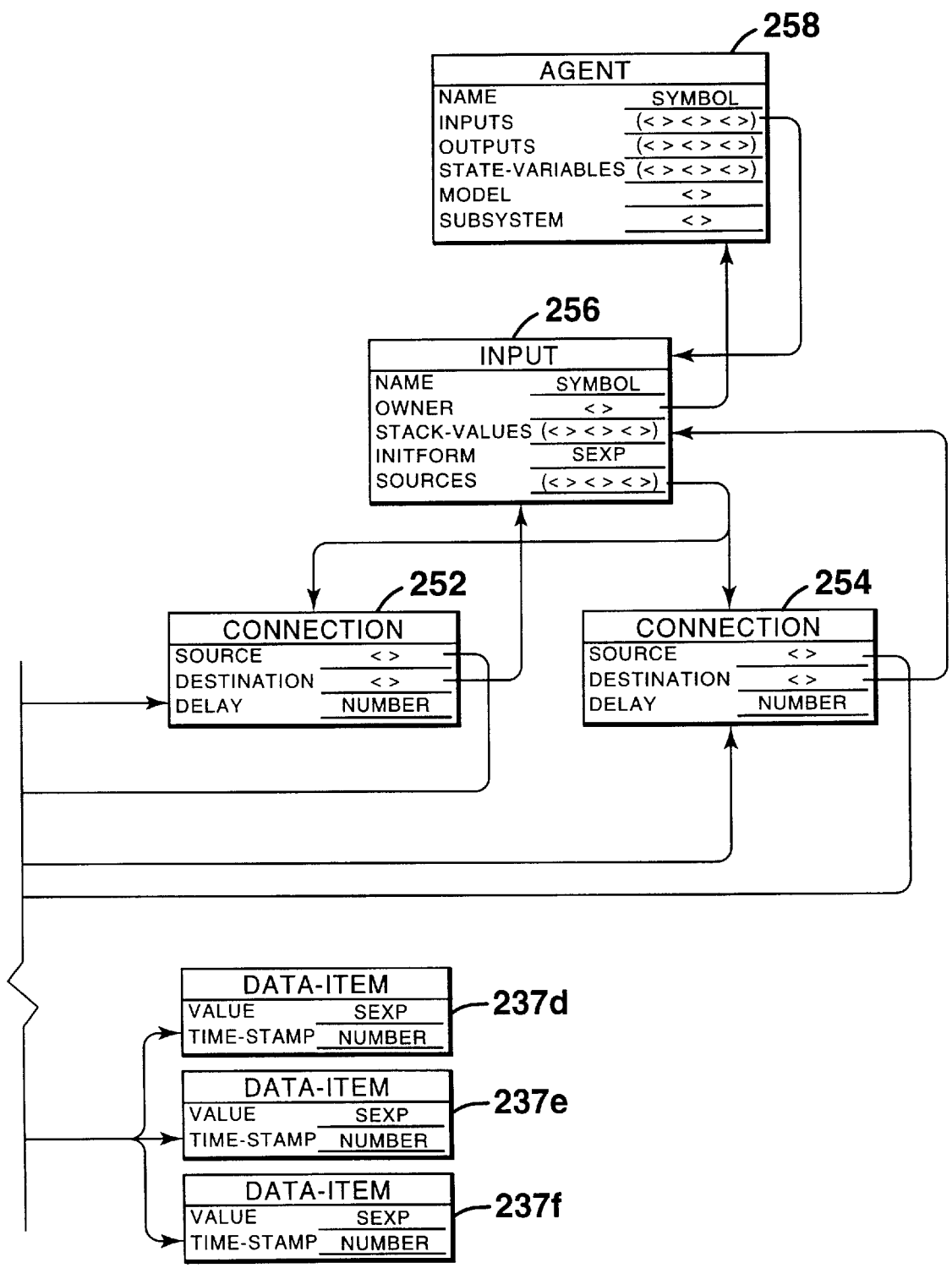

Referring now to FIGS. 7A and 7B and 7C, an example of a hierarchical state variable is shown. The diagram is best understood by referring to FIG. 7A. User specified initform could institute a hierarchy to override both agent state variables and other subsystem state variables.

In FIG. 7A, subsystem state variables 210 and 212 are shown cascading to and overriding both subsystem state variables and agent state variables. For example, subsystem state variable 210 is cascaded to subsystem state variables 214 and 216. It is also shown that subsystem state variable 210 can override subsystem state variables 214 and 216 to initiate agent state variable 222 and 224. Further, subsystem state variable 212 is shown directly initiating agent state variable 226. FIG. 7B and 7C are a detailed version of FIG. 7A where the cascading and overriding aspects of the hierarchy are shown.

FIGS. 8A, 8B, 8C and 8D form a block diagram of agent data structures. Model 230 is generated based on agent data structure interaction as shown. Subsystem 232 is in communication with model 230 and agent 234. State variables 236, 236' and 236" are in communication with agent 234 and maintain time-stamped data-item 237, 237 'and 237"; 238a, 237b, 237c and 237d, 237e and 237f.

Similarly, agent outputs 238, 238' and 238" are in communication with agent 234 and also include a stack of time-stamped values in data-items 239, 239', 239"; 239a, 239b and 239c. Further, agent inputs 240, 240' and 240" are in communication with agent 234 and include a stack of time-stamped values in data-items 241, 241', 241"; 241a, 241b and 241c.

Connection 242, output 244, agent 246, input 248 and connection 250 have communication therebetween and further provide communication at connection 242 and connection 250 with input 240 and 240", respectively. Similarly, connection 252, connection 254, input 256 and agent 258 have communication therebetween and connection 252 and connection 254 are in communication with output 238" and output 238', respectively.

Figure 9A:
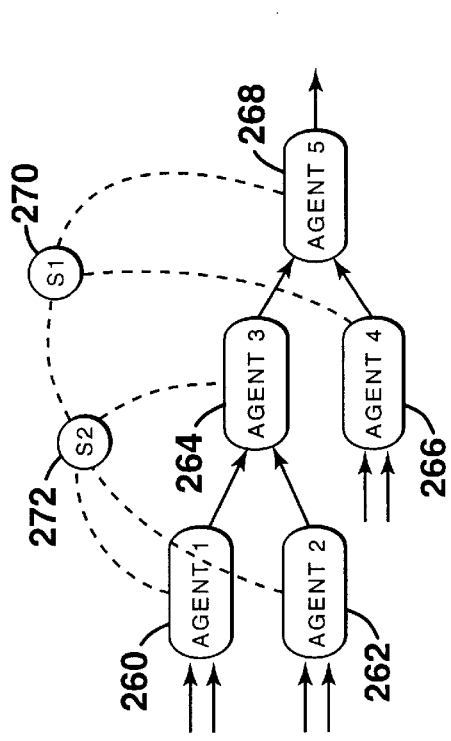
FIGS. 9A, 9B, 9C, 9D, 9E, 9F, 9G, 9H, and 9I form a block diagram showing model subsystems data structure examples.
Figure 9I:
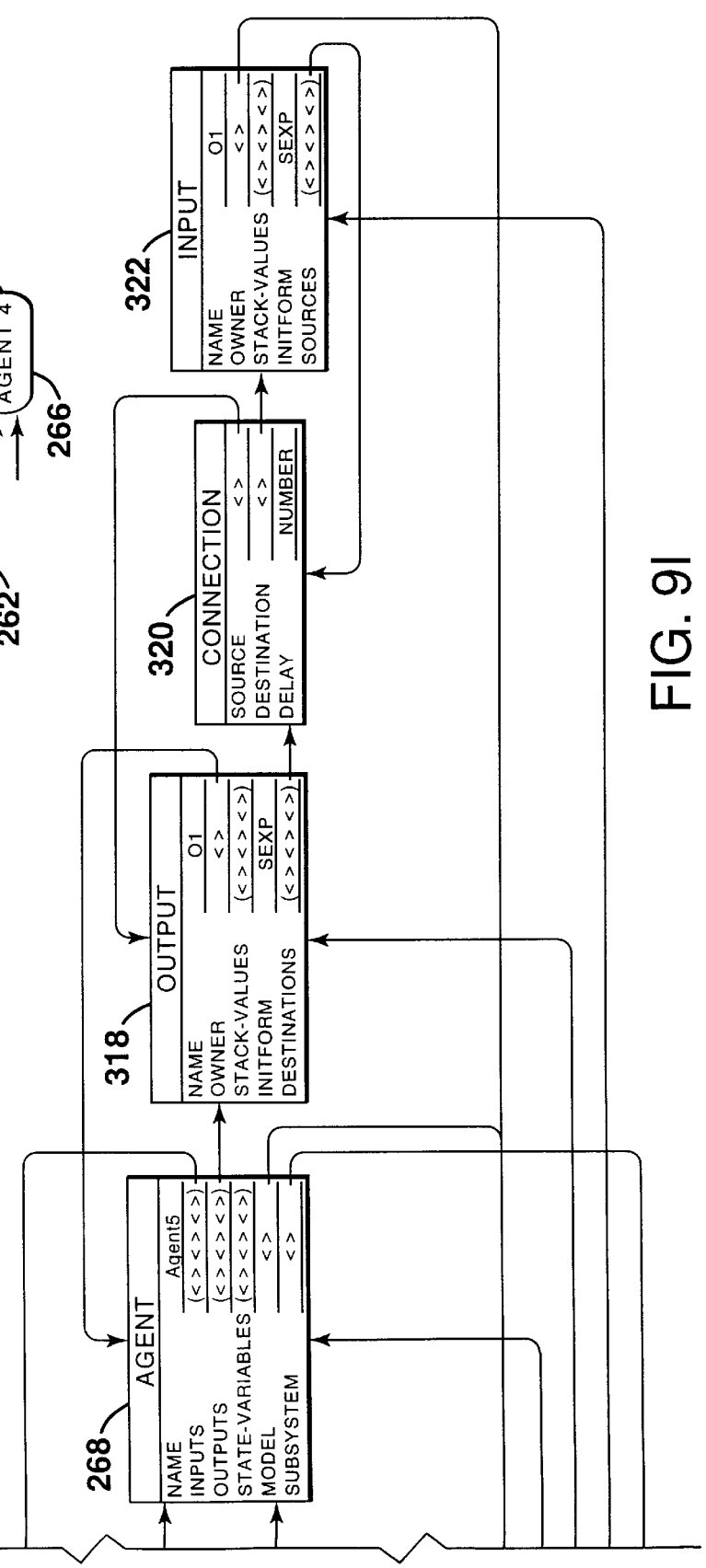

Referring now to FIGS. 9A, 9B, 9C, 9D, 9E, 9F, 9G, 9H, and 9I a detailed example of model and subsystem data structure are shown. FIG. 9A is a simplified version of FIG. 9B. The solid line connection indicates an agent-interaction whereas the broken line connection depicts a subsystem structure. Accordingly, agents 260 and 262 are in interactive communication with agent 246. Similarly, agents 264 and 266 are in interactive communication with agent 268. Subsystem 270 includes a subsystem communication with subsystem 272. Further, subsystem 270 is connected with agents 262 and 268. Similarly, subsystem 272 is connected to agents 260, 262 and 264.

Figure 9B:
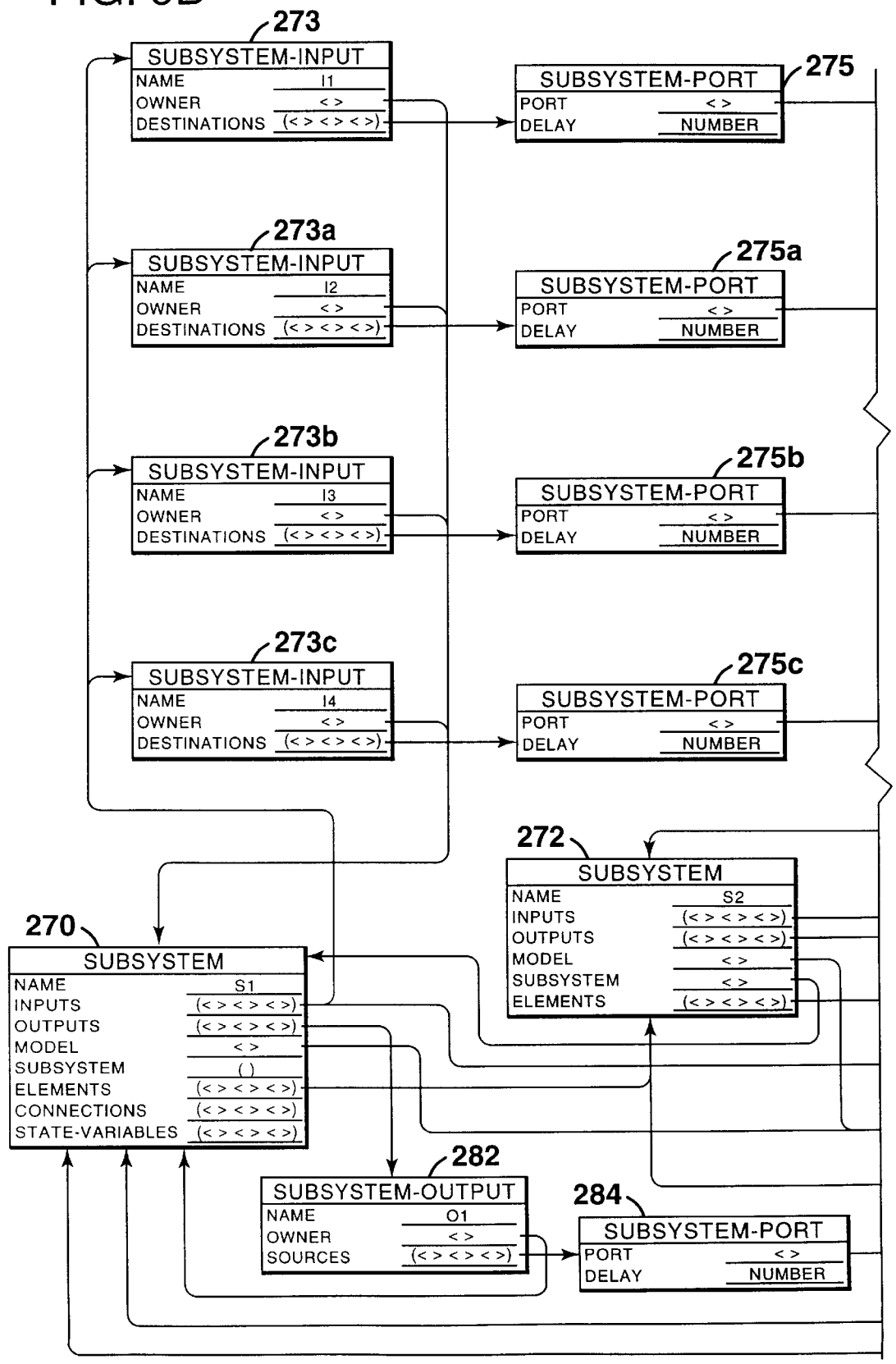
Figure 9C:
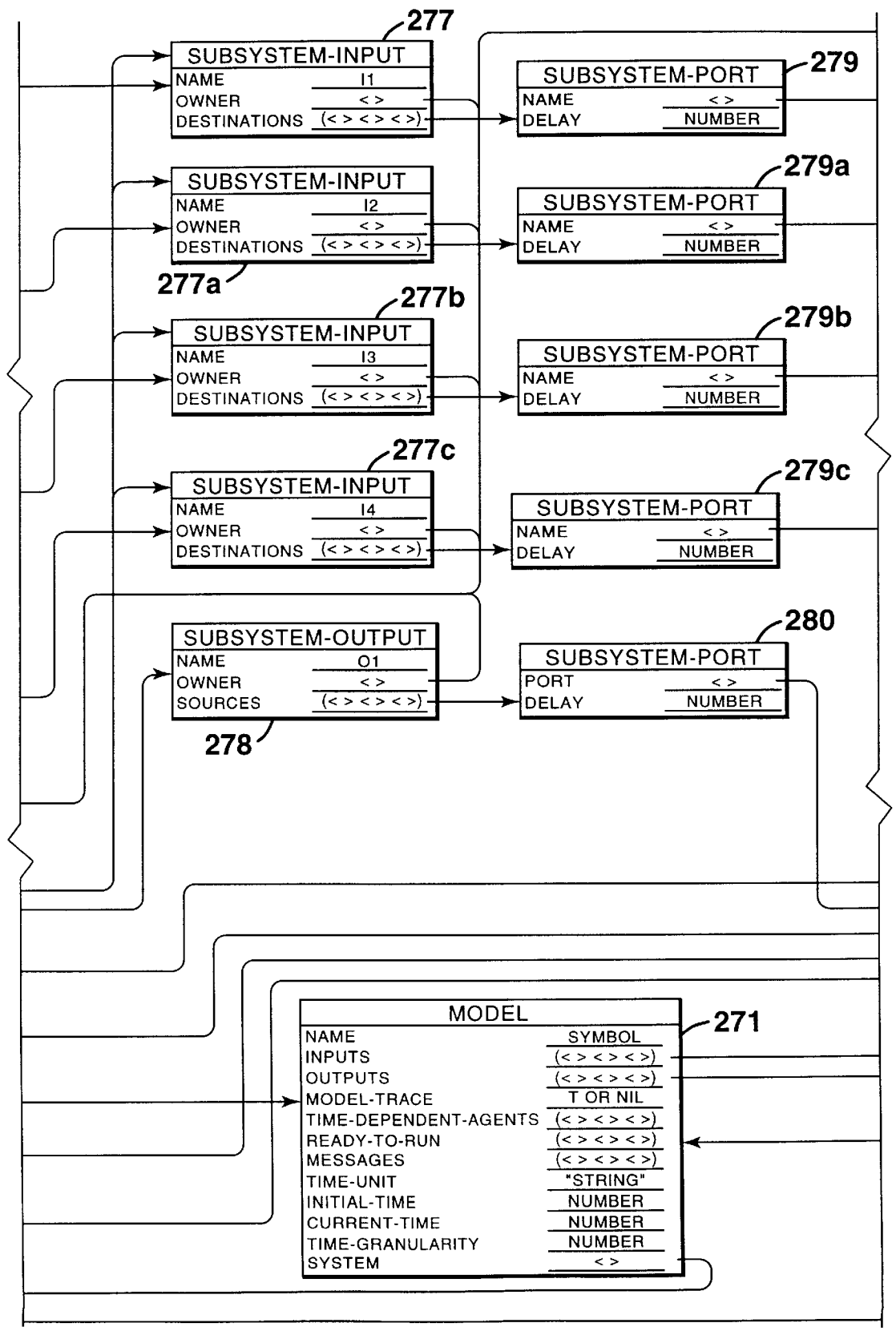
Figure 9D:
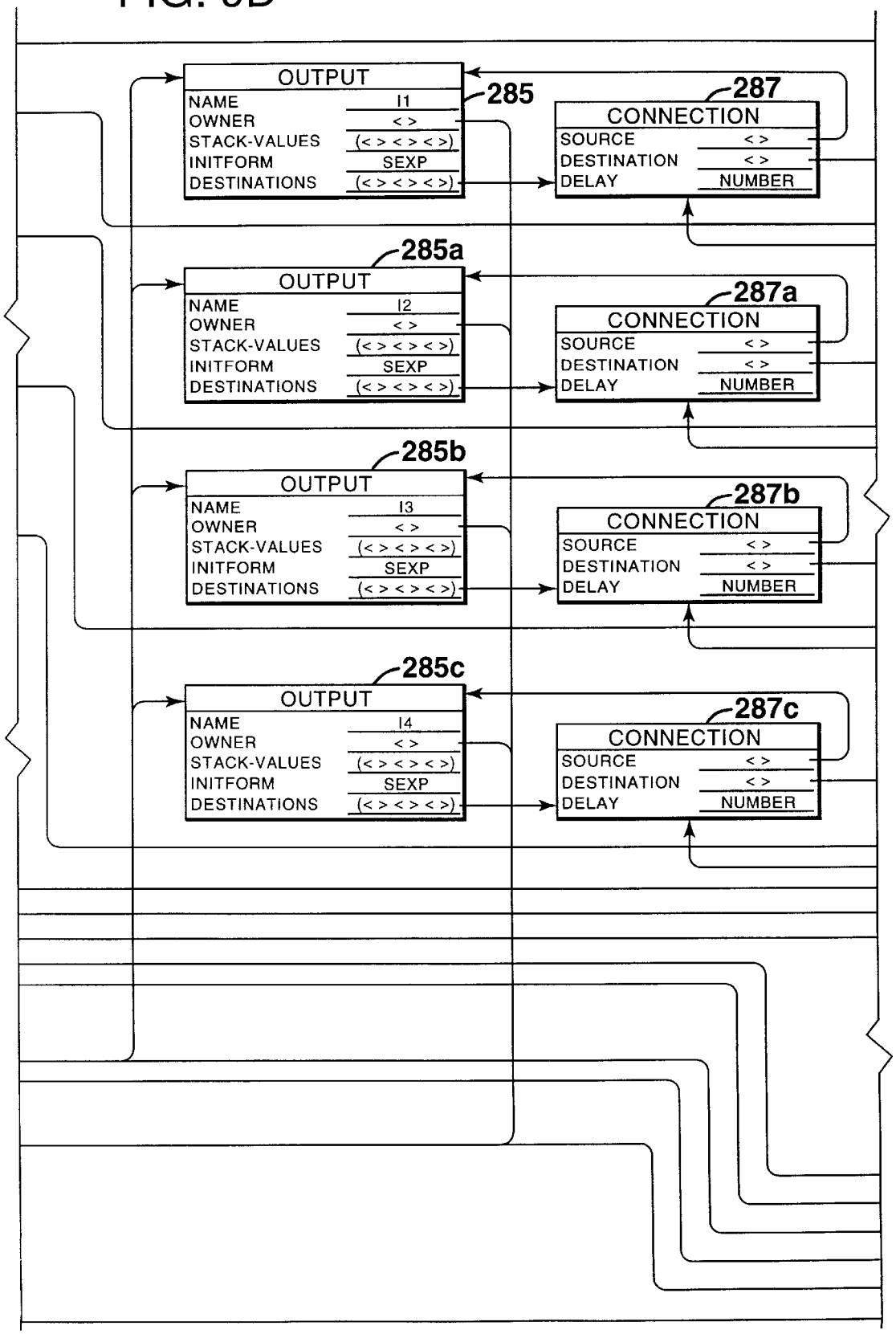
Figure 9E:
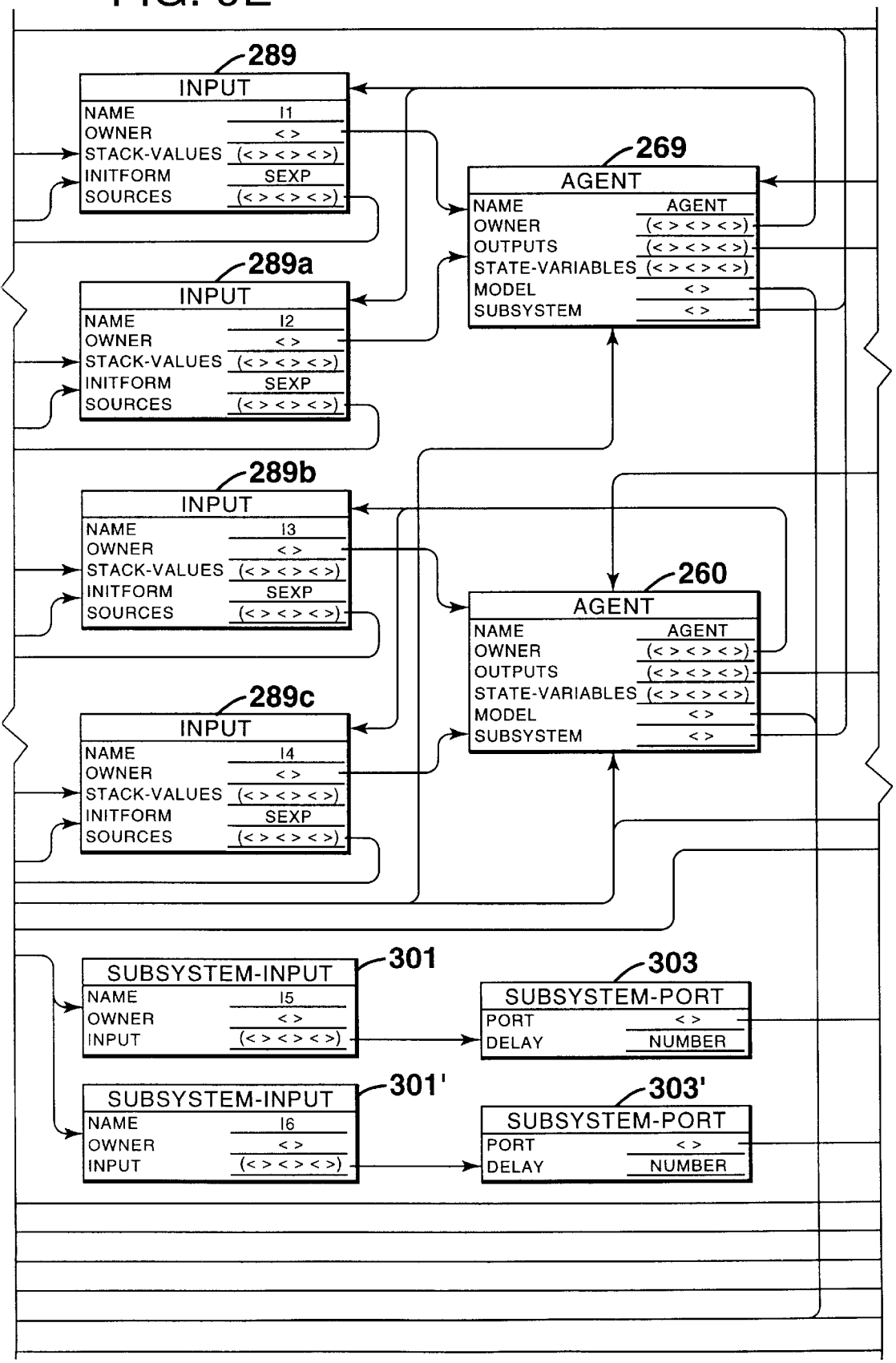
Figure 9F:
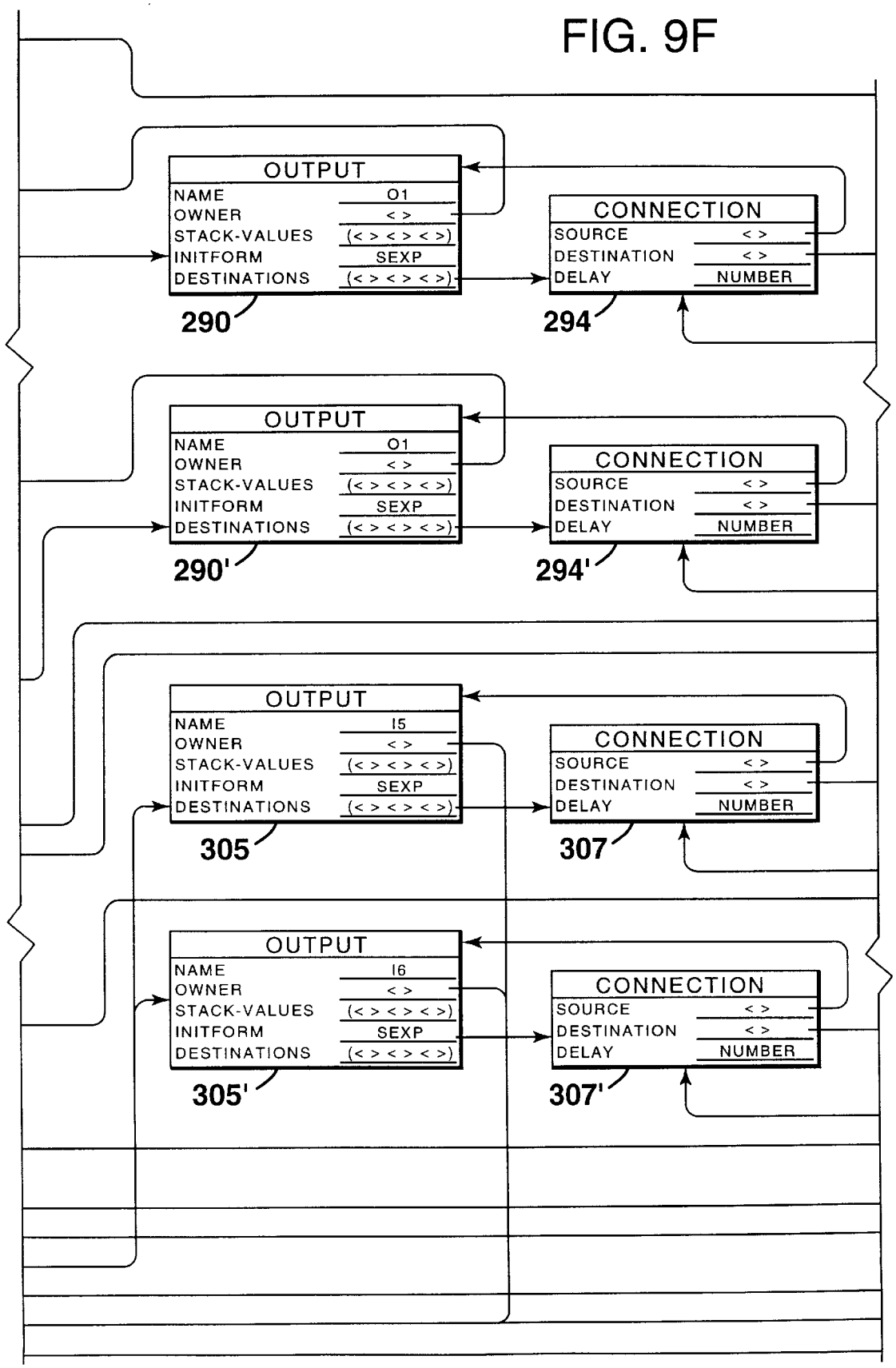
Figure 9G:
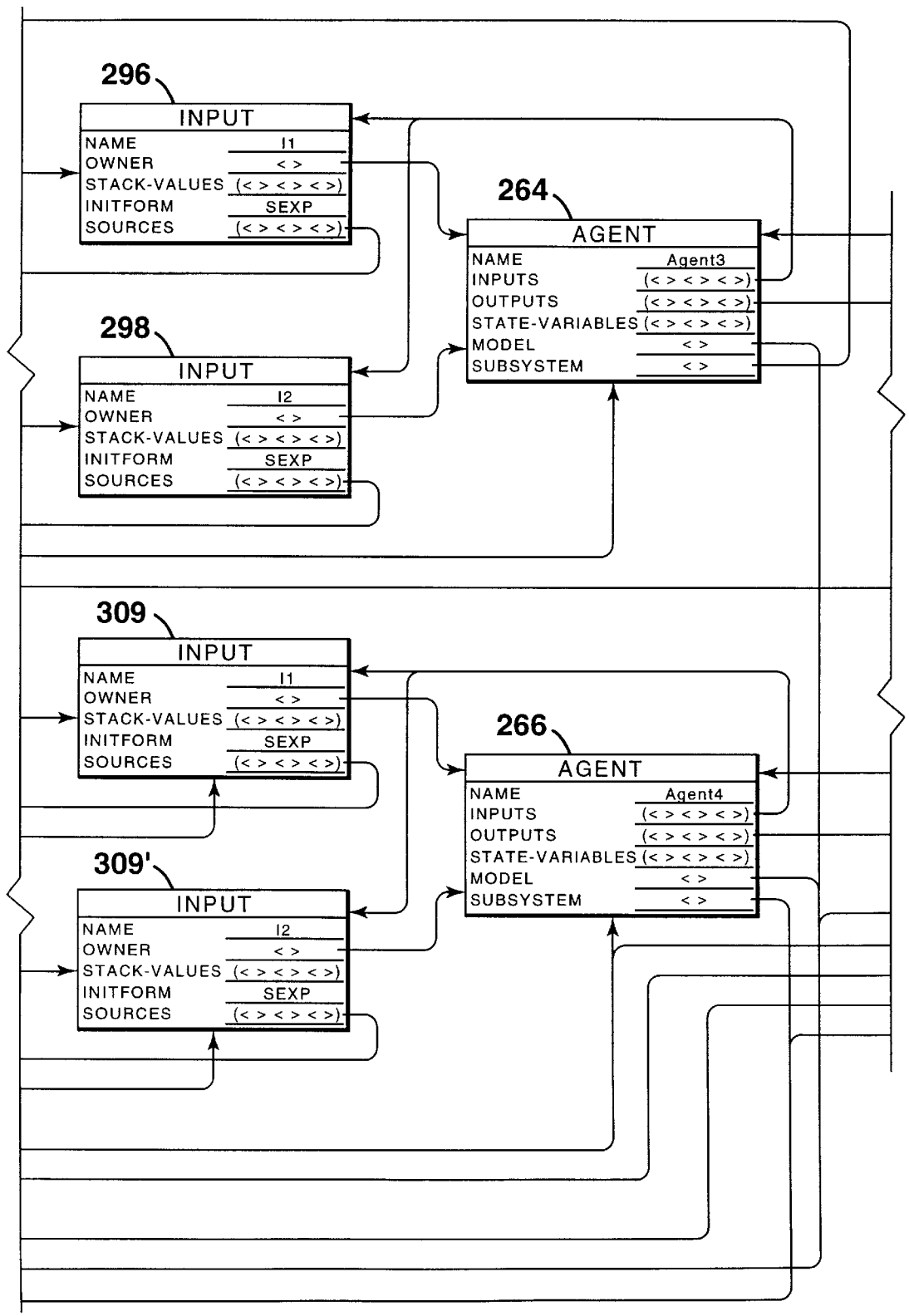
Figure 9H:
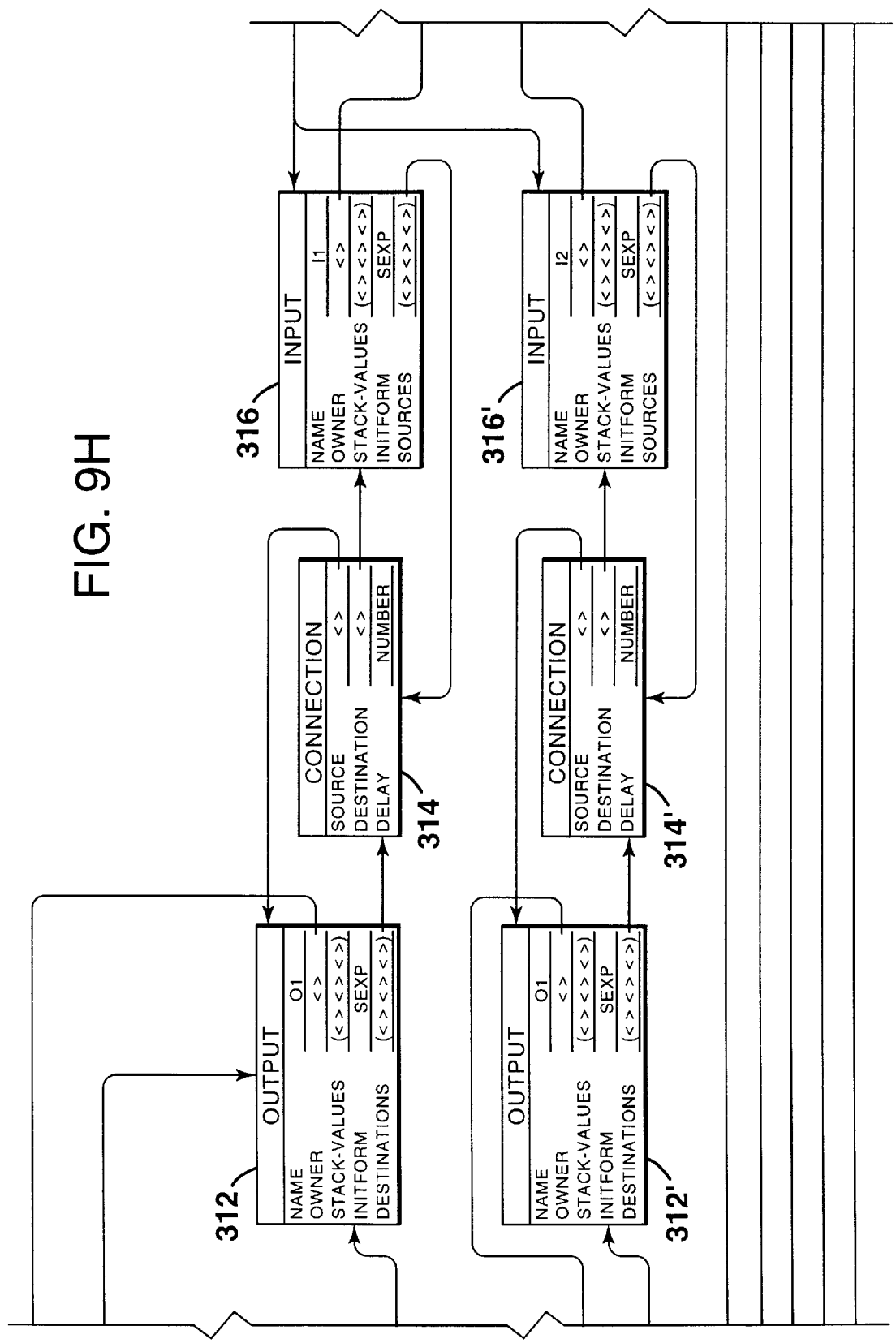

FIG. 9B is a detailed data structure for building model 271 using agents 260, 262, 264, 266 and 268 and subsystems 270 and 272. The example shows the network which is generated when model 271 is initiated. Subsystem 270 includes connections with model 271, subsystem inputs 273, 273a, 273b and 273c and subsystem port 275, 275a, 275b and 275c. Similarly, subsystem 272 is in communication with model 271 and subsystem-inputs 277, 277a, 277b and 277c, subsystem port 279, 279a, 279b and 279c. Further, subsystem 272 includes connections with subsystem output 278 and subsystem port 280. Model 271 is in two-way communication with output 285, 285a, 285b and 285c. Connections 287, 287a, 287b and 287c and input 289, 289a, 289b and 289c are in interactive communication with outputs 285, 285a, 285b and 285c; inputs 289 and 289a, respectively. Further, agent 262 is connected with output 290 which is in turn connected to connection 294 and input 296. Agent 260 follows the connection pattern as agent 262 and is connected to output 290' and connection 294' culminating in input 298. Both inputs 296 and 298 are in two-way communication with agent 264.

Subsystem 270 is connected to subsystem inputs 301 and 301'. The inputs are in turn connected to subsystem ports 303 and 303', respectively. Outputs 305 and 305'are in dual communication with connection 307 and 307', respectively. The connections are further joined to input, 309 and 309'. Subsystem ports 303 and 303'are joined to input 309 and 309'. Agent 266 includes connections with inputs 309 and 309' as well. Agent 264 and agent 266 are in communication with input 312 and 312', respectively. Similarly, connection 314 and 314' are in communication with output 312 and 312', respectively. Inputs 316 and 316' are in communication with agent 268 and are also connected to connections 314 and 314', respectively. Output 318 is in dual communication with agent 268 and is connected to connection 320. Input 322 is in communication with connection 320, model 271 and subsystem 270. It should be noted that the network is complex even when a small model is structured. The connections shown relate to both dual and multiple contacts. In order to simplify the discussion and to limit confusion, for the most part, direct line connections are discussed. This is by no means a limitation on the drawings; and in any event, the drawings govern the overall concept of the model subsystem and data structure.

Figure 10:
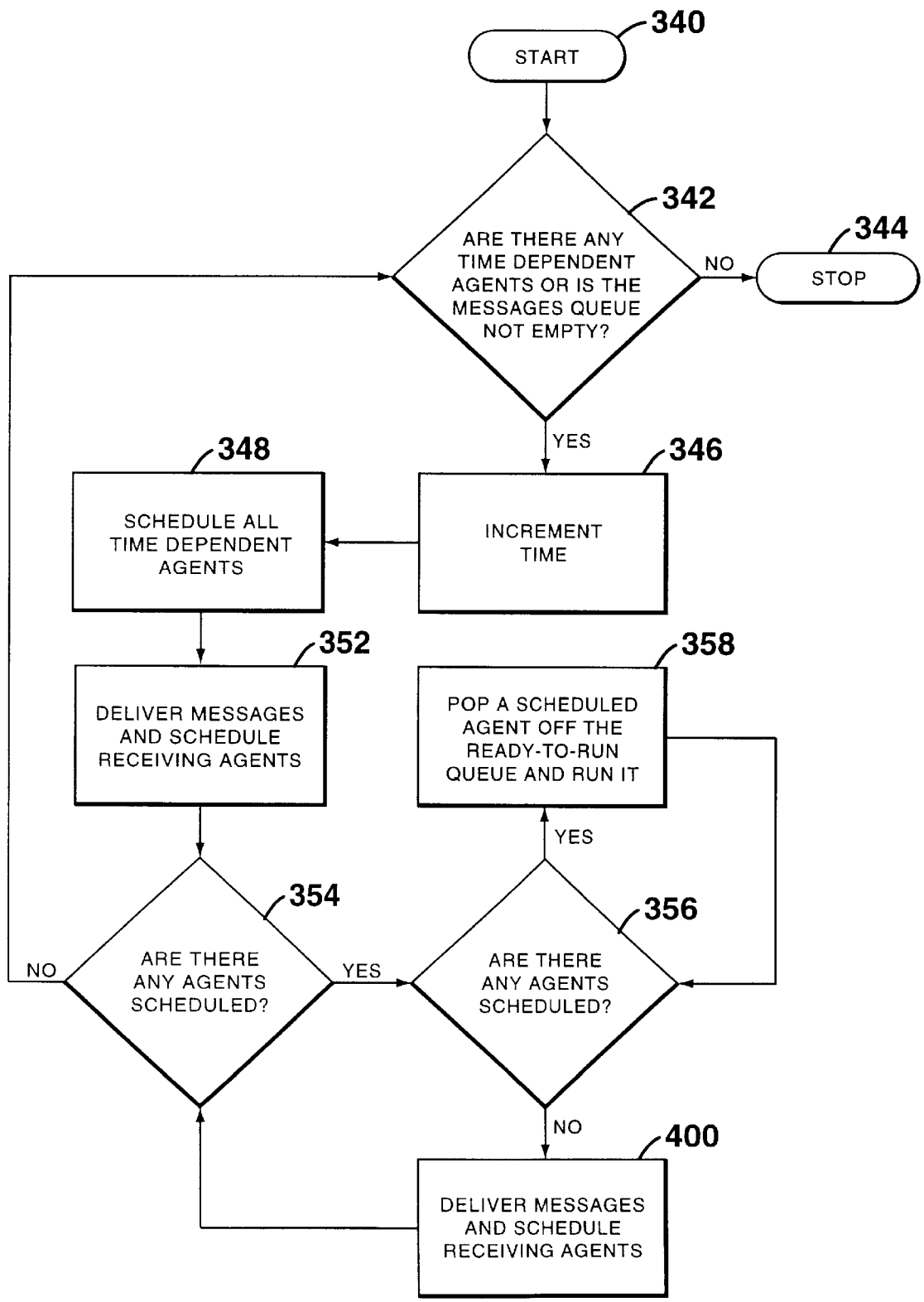
FIG. 10 is a logic chart showing a simulation loop.

FIG. 10 is a flow chart representing the simulation algorithm. The program is initialized under block 340. Consequently, decision block 342 is implemented to check if there are any time dependent agents or if the messages queue has any contents. The program proceeds to block 344 to stop if the inquiry under decision block 342 is negative. If the inquiry results in a positive response, the program proceeds to block 346 to increment time. When the increment time is completed, all time dependent agents are scheduled under block 348. Receiving agents are scheduled and messages delivered under block 352. The program proceeds to decision block 354 where the program checks if there are any scheduled agents. If there are none scheduled, the loop goes back to decision block 342. If there are scheduled agents the program proceeds to decision block 356 to check if there are any agents in the ready-to-run queue. If the response to the query is positive the loop proceeds to block 358 and commands to extract or pop a scheduled agent off the ready-to-run queue and run it. If the response is negative, the loop proceeds to block 400 and orders to deliver messages and schedule to receive agents. The information is then directed to decision block 354 to be processed consistent with the parameters set under this block.

The discussion hereinabove relates to the structural elements which comprise the computer implemented as embodied in computer-variable media temporally driven functional causal model simulation engine. The discussion hereinbelow, without limitation, deals with the implementation and fundamentality of the simulation engine of the present invention.

One approach that is advanced by the present invention is that the behavior of agents can be represented functionally on the basis of a mapping between sets. As defined hereinabove the word "agent" refers to the actual subject under consideration for simulation. The word "object" refers to the representation of the actual subject. Agents are represented by objects comprising of a set of inputs, outputs and state variables. The inputs and outputs are used to represent interactions between agents. Agent interactions are defined as agent behavior that may affect the behavior of some other agent. Agent interaction is modeled as a data flow from the causing agent to the affected agent. This data flow represents the transmission of force in the case of physical agents, for example. For agents that are intellectual abstractions this data flow represents the transmission of data.

State variables are used to represent the state of an agent at a particular point in time. The state of an agent varies over time (t) with respect to its inherent behavior and its interactions with other agents. State variables usually represent characteristics of the agent that vary over time. Examples of such characteristics include: a) physical agents which may have spatial and orientational positions; b) lights may be on or off; c) data abstractions may have a value; d) hydraulic lines may have high or low pressure. At any given point in simulated time, each of an object's inputs, outputs and state variables may or may not have a value. If an input, output or state variable has a value, it will be an element of some set. These sets may be different for each input, output and state variable.

Referring now to FIGS. 1A and 1B, a system of interacting agents is shown hierarchically grouped into a tree structure of agents and subsystems. System 10 is defined as a discrete set of interacting agents. Thus, system 10 can be conceptualized as a macro agent with an overall behavior. When a system is hierarchically grouped as in FIGS. 1A and 1B, the lower level systems are depicted by subsystems such as subsystems 12 and 14. The hierarchies may be arbitrarily deep. The hierarchical groupings are merely intellectual abstractions used to simplify the representation of a set of interacting agents such as agents 16, 18, 22, 24, 26, 36, 38, 42, 44, 46 and 48. As shown in FIG. 1B, a group of agents form a subsystem. Thus, the eleven agents of FIGS. 1A and 1B are organized into a hierarchy of four subsystems.

The behavior of agents and their interactions are temporally dependent. The behavior of agents is not instantaneous but rather has durations or occurs over an interval of time. For many systems, the order in which agents interact greatly affects the overall behavior of the system. The order or sequence in which agents interact is dependent on the duration associated with individual agent behaviors. Accordingly, to accurately model the interaction of agents, time must be simulated along with behavior durations.

The behavior of an agent can be represented as a function of its inputs, state variables and time. This function may cause updates to the outputs and state variables of the object. In mathematical terms this function is a representation of a set of functions.

Thus, if F is a set of functions that describe the behavior of an agent, the set of functions or sub-functions are I, S and t representing inputs, state variables and time. Functions in F are (1 +n +1) dimensional mappings to the single dimension of the target output or state variable. The domain and range dimensional sets are over the sets designed in V.

$$F=\{f_{o1}(I,S,t)=0_1, f_{o2}(I,S,t)=0_2 \ldots f_{om}(I,S,t)=0_m, f_{s1}(I,S,t)=S_1, f_{s2}(I,S,t)=S_{21} \ldots f_{sn}(I,S,t)=S_n\}$$

It should be noted that an actual implementation of the functions in F for a particular object is typically a single function that incorporates all the output and state variable updates defined over F.

Referring now to FIG. 2, the data structures comprising the simulation engine kernel classes which get instantiated are shown. The objects in the first column which include subsystem class 52 and agent class 54 are used in model descriptions. The objects in data item 56, message 58, input and outputs 64 and 66, state variable 68 and state variable link 72, connection 74, subsystem port 76 and, subsystem input and subsystem output 78 and 82 are used to instantiate the model. Further, model 84, subsystem 86 and agent 88, which are also in the agents category, are also implemented for model initiation.

The present invention utilizes a kernel to define, build and run models. An actual model contains a network of instances of classes. When the model runs, agent activation as well as data flow is achieved through message passing (method calls).

FIG. 3 shows agent classes. Agent class 90 includes initiable-data 92, 94, 96, 102 and 104. Agent classes contain all the information needed to create instances of that agent. The data is used by the agent's initialize-instance method (inherited from the agent metaclass).

For the purposes of this invention, classes end with either the word "metaclass", "class" or "mixin". Classes ending in "metaclasses" are just that, a metaclass. Classes ending in "class" are classes that will actually get instantiated whereas classes ending in "mixin" are superclasses that are never instantiated but are used only to pass on slots and methods to other classes or superclasses. The mixin convention is a commonly used term in object programming.

Referring to FIG. 3, agent-class 90 receives several slots from an agent metaclass. It should be noted that inputs and variables have objects to describe them whereas outputs do not. The inputs and state variables have a name and an initform. More significantly, they are structured to consist (as composites) of more than one composite data structure. Outputs, however, have just a name. The present invention utilizes class instances to contain composite values. This is different from the use of lists, arrays or some other data structure used to contain/structure composite values.

Some simulation engines execute every object every time slice. This may be inefficient and extraneous because many agents need only to be triggered/executed after they have received a new input. The present invention enables a setup in which execution is based on the passage of time or on the reception of a new input. Time dependent agents are agents which are executed every time slice. An example of a time dependent agent is a system clock that is used to synchronize the rest of the system. The clock may not have inputs. However, its outputs are used to simulate behavior or effect on other agents in the system. The default is that agents are not time dependent. Entire agent classes may or may not be time dependent.

When a model is created, all the time dependent agents are stored in a list in the model instance. When the model is simulated, all time dependent agents are scheduled for execution whenever simulated time is incremented. Model builders interact with the simulation engine via a limited set of methods; read-inputs; read all inputs; post output; read-state-variable and update state variable. The present invention enables the simulation of models with significantly less time and steps.

One of the significant aspects of the present invention is based on taking a model description and using it to create and drive a simulation. In order to simplify the disclosure of the simulation a simple example is disclosed in FIG. 4 to show a single agent class. As discussed hereinabove, a basic agent-class 106 is used in the model. Agent-class 106 includes two inputs I1 and I2 and a single output O1.

FIG. 5B and 5C show subsystem class 116. A model hierarchy with three levels all comprising class "agents" are formed. The three levels include: subsystem-elements 118, 120 and 122; subsystem-connection 126 and 128; and subsystem input-ports 134, 136, 138, 140 and 142.

Models are represented hierarchically to simplify construction and description. To simulate a model, a model instance is created by instantiating the top level subsystem. The data structure that does the simulation is a "flattened" model graph. This is a network (graph) of the agents and their connectivity. The hierarchy is not utilized when it comes to actually operating (running) the model. Accordingly, the hierarchy stays dormant and does not play an active role in simulations.

FIGS. 6A, 6B, 6C and 6D show the class structure. The structure is an object oriented implementation based on CLOS, the standard object oriented extension to common Lisp. Metaclasses are used extensively to capture class wide information such as the structure of a subsystem or class information such as the class instances list.

As disclosed in FIGS. 6A, 6B, 6C, and 6D the class structure includes enhanced-standard-metaclass 146 which has a super class link with block metaclass 152. Further, model-class 164 consisting of slots and methods provides a metaclass link with block-metaclass 152. Enhanced-standard-superclass 148 has a metaclass link with enhanced-standard metaclass 146 and comprises of slots for names and methods to initialize-instance, delete-instance and enhanced-defclass (macro). Enhanced-standard superclass 148 has direct or indirect super class link with all subsystems or classes.

The hierarchical state variables of the present invention enable the user to set up initform overrides which will cascade down through the hierarchy. A typical hierarchical state variables example is shown in FIGS. 7A and 7B. A single subsystem state variable 210 may override both agent state variables such as 222 and other subsystem state variables such as 214 and 216 to initialize agent state variables of choice.

Referring now to FIGS. 8A, 8B, 8C and 8D agent data structures are shown in relation to a model 230 and subsystem 232. As discussed hereinabove, agent instances contain the data stacks which contain the history of a simulation. Each agent input, output and state variable maintains a stack of time-stamped values which represent a history of a temporal record of the activity of the agent under consideration. For example, agents 234, 242 and 258 in FIG. 8 include a stack of values. For purposes of simplicity, considering only agent 234, the stack of values associated with it include, outputs 238, 238' and 238". The outputs include stack-values which are time-stamped in data-items 239, 239', 239" and data-items 239a, 239b and 239c. Similarly, inputs 240, 240' and 240" include data-items, for example 241, 241' and 241" which have time-stamped values. Further, state variables 236 and 236" include time-stamped data-items 237, 237' and 237" as well as 237a, 237b and 237c; and 237d, 237e and 237f. Thus, the agent data structure is a stack of values which indicate a time-based record of the agent's activity in a given subsystem from which a model can be generated for simulation purposes.

FIGS. 9A, 9B, 9C, 9D, 9E, 9F, 9G, 9H, and 9I provide a model and subsystems data structure. FIG. 9A is a simplified version and will be discussed herein. The interaction between agents and subsystems includes hierarchical connections. Agents 260 and 262 interact with agent 264. Agent 266 and agent 264 interact with agent 268. Subsystems 270 and 272 have a subsystem structure which is resident in agents 260, 262, 264, 266 and 268. As is shown in FIG. 9B, 9C, 9D, 9E, 9F, 9G, 9H, and 9I the network can be complex for even a small model. Much of the complexity is created because of the need to support hierarchical model descriptions, many point-to-point connections and timing capabilities (delays).

Referring now to FIG. 10, the main simulation loop is presented. Within the model instance there are three essential data structures. These structures include the message queue, the ready-to-run queue, and the time dependent agents list. The activities of the model can be summarized as a process that operates on these data structures. The behavior of a model has four basic activities, namely: (i) sending messages (placing messages on the message queue); (ii) delivering messages (from the message queue to agent input objects); (iii) scheduling agents for execution (place agents on the ready-to-run queue); and (iv) running agents (popping an agent off the ready-to-run queue and running it).

Sending messages is accomplished from within an agent's run method with a call (command) to post-output. When post-output is called for a set of messages is added to the message queue with a time-stamp as to when each message is to be delivered. There may be multiple message destinations, each with a different timestamp. The timestamp variances are derived from the values of the static delays from the connection objects which link to each of the destination input objects.

The other three main activities are initiated from within the models main simulation loop shown in FIG. 10. All messages in the message queue are ordered in accordance with their respective time-stamp. As time is incremented, the messages "come due" and are delivered to the agent input objects. The delivery of a message causes the agent to be scheduled. When an agent is scheduled, it is placed on the ready-to-run queue. At any given time more than one agent may be on the ready-to-run queue. These agents are assumed to be executing independently and in parallel, hence they may be executed in any order without compromising the realistic assessment and operation of the simulation. Agents may also be scheduled if they are time dependent and time has been incremented. Agents are executed by merely popping them off the ready-to-run queue and invoking their run methods.

Referring now to FIG. 10 in more detail, the simulation engine is initiated via an operator interface, such as a keyboard on a computer. Thus the simulation loop is started under block 340 and proceeds to decision block 342. The software poses certain questions to provide/decide the next step in the simulation loop. Because of the temporal nature of the software all time dependent agents are first identified or the system is asked if the message queue is empty. If there are no time dependent agents, or if the message queue is empty, the simulation is terminated under block 344. In the alternate, if the response to the query under 342 is positive, the simulation proceeds to block 346. Here, time is incremented either on the agent or the messages resident in the queue. It should be noted that an agent is scheduled either by receiving a new input or in the case of time dependent agents, after time is incremented. Therefore, under block 348 all time dependent agents are scheduled and the loop proceeds to block 352 where messages are delivered and receiving agents for the messages are scheduled. Once the operation under block 352 is executed the loop proceeds to decision block 354 where the logic checks if there are any agents scheduled. If the response is negative, the loop goes back to decision block 342. In the alternate, if the response is in the affirmative, the logic proceeds to decision block 356 to re-check if there are any agents scheduled in the ready-to-run queue. If this is confirmed, the logic proceeds to pop a scheduled agent off the ready-to-run queue and run it under block 358. If the response is negative, the logic proceeds to block 400 under which messages are ordered to be delivered and a schedule is set to receive agents. The loop proceeds back to decision block 354 thereby forming a subroutine loop.

Figure 11:
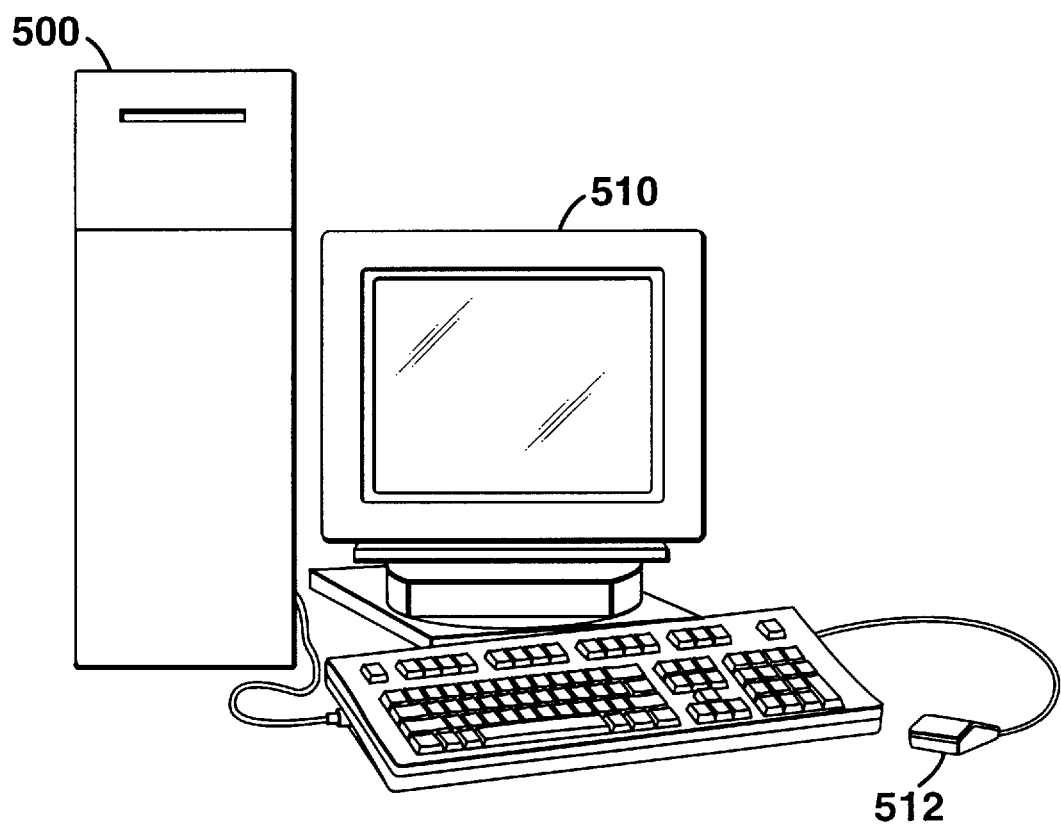
FIG. 11 is a conceptual outline of the implementation of the present invention in a computer.

FIG. 11 indicates the implementation of the present invention. Computer 500 includes memory and a simulation engine software. Computer 500 is in operative electronic connection with display 510 and mouse 512. The software of the present invention is initiated by a menu driven command means and the operator is enabled to interact with the software via the keyboard at the display 510 and mouse 512.

Having thus described the preferred embodiments of the present invention, those skilled in the art will readily appreciate the many other embodiments which can be employed with the scope of the claims provided below.

What is claimed is:

1. A computing system for representing and model agents based on interactions of the agents, comprising:

a simulation engine comprising:

means for setting up program execution based on one of time element and reception of a new input;

means for identifying and executing the agents which are dependent on the time element;

means for simulating effect of outputs of said interactions of the agents on other agent systems; and default means for identifying any of the agents which are independent of said time element;

a computer for storing and executing the simulation engine;

means for entering data into the simulation engine. electrically connected to the computer; and a display for displaying data entered into the simulation engine, electrically connected to the computer.

2. The computing system of claim 1, wherein the simulation engine further comprises three levels of class agents.

3. The computing system of claim 2 wherein said three levels of class agents include subsystem elements, subsystem-connection and subsystem input-ports.

4. A computing system for simulating a model wherein all time dependent interaction agents are stored in a list of the model instance, comprising:

a simulation engine with a hierarchical model description comprising:

means for executing all time dependent agents based on a hierarchy;

means for generating a network of the agents and their hierarchical connections;

means for setting up initform overrides to cascade down through said hierarchy; and means for generating agent data structures;

a computer for storing and executing the simulation engine;

means for entering data into the simulation engine. electrically connected to the computer: and a display for displaying data entered into the simulation engine electrically connected to the computer.

5. The computing system of claim 4. wherein the simulation engine further comprises means to generate the instance of the model by instituting a top level subsystem.

6. The computing system of claim 5 wherein the data structure includes a stack of values which indicate a time-based record of interaction between agents in a given subsystem from which a model can be generated.

7. The computing system of claim 6 wherein the interaction between agents and subsystems includes said hierarchical connection.

8. A method of modeling agents based on interactions of the agents, comprising the steps of:

initializing a simulation;

identifying all time dependent agents;

storing a message in a message queue;

terminating the simulation if there are no time dependent agents, and if there are no messages in said message queue;

incrementing time on one of said time dependent agents;

scheduling time independent agents by receiving a new input;

incrementing time; and popping a scheduled agent off a ready-to-run queue;.

9. The method of claim 8 wherein said agents include a set of inputs, outputs and state variables.

10. The method of claim 8 wherein the interactions of the agents includes a hierarchical group of the agents into a tree comprising agents and subsystems.

11. The method of claim 9 wherein said set of inputs and outputs include a stack of time-stamped values and further said set of inputs and outputs represent interactions between agents.

12. A computer system for defining, building, and representing object oriented models such that when the model runs, agent activation and data flow is executed through message passing, comprising:

a simulation engine comprising;

means for generating instances of the agent;

means for distinguishing between classes, metaclass, superclass and mixin such that an agent-class can receive slots from agent metaclass, where as agent-mixins are used only to pass on slots and methods to other classes or superclass;

object means for structuring inputs and variables to be described by said object;

means for structuring inputs and variables to comprise more than at least one composite data structure; and interaction means for model builders to interact with said simulation engine; a computer for storing and executing the simulation engine;

means for entering data into the interaction means, electrically connected to the computer; and a display for displaying data entered into the interaction means, electrically connected to the computer.

13. The computer system of claim 12 wherein said interaction means includes means for interaction of model builders with the simulation engine via a limited set of methods; read-input; read-output; read-all-inputs; post input; read-state-variable and update state-variable.

* * * * *